United States Patent
Koshida et al.

(10) Patent No.: US 12,317,499 B2
(45) Date of Patent: May 27, 2025

(54) SEMICONDUCTOR MEMORY DEVICE

(71) Applicant: Kioxia Corporation, Tokyo (JP)

(72) Inventors: Tatsuki Koshida, Yokkaichi (JP);
Takayuki Ishikawa, Yokkaichi (JP);
Kenzo Manabe, Yokkaichi (JP);
Daisuke Kuwabara, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 400 days.

(21) Appl. No.: 17/885,739

(22) Filed: Aug. 11, 2022

(65) Prior Publication Data

US 2023/0301108 A1    Sep. 21, 2023

(30) Foreign Application Priority Data

Mar. 17, 2022  (JP) .................. 2022-042299

(51) Int. Cl.
*H10B 43/30*        (2023.01)
*H10B 43/40*        (2023.01)
*H10D 64/01*        (2025.01)

(52) U.S. Cl.
CPC ............. *H10B 43/40* (2023.02); *H10B 43/30* (2023.02); *H10D 64/037* (2025.01)

(58) Field of Classification Search
CPC ........................... H01L 29/40117; H10B 43/30
See application file for complete search history.

(56) References Cited

U.S. PATENT DOCUMENTS

| | | | |
|---|---|---|---|
| 10,636,803 B2 | 4/2020 | Kato et al. | |
| 11,417,669 B2 | 8/2022 | Han et al. | |
| 2018/0269218 A1* | 9/2018 | Kato | H10B 43/40 |

FOREIGN PATENT DOCUMENTS

| | | |
|---|---|---|
| JP | 2018-156975 A | 10/2018 |
| TW | 202137491 A | 10/2021 |

* cited by examiner

*Primary Examiner* — Mohammad M Choudhry
(74) *Attorney, Agent, or Firm* — Oblon, McClelland, Maier & Neustadt, L.L.P.

(57) ABSTRACT

A semiconductor memory device includes a semiconductor layer extending in a first direction, a conductive layer opposed to the semiconductor layer in a second direction intersecting with the first direction, an electric charge accumulating layer disposed between the semiconductor layer and the conductive layer, a first insulating layer disposed between the semiconductor layer and the electric charge accumulating layer, and a second insulating layer disposed between the conductive layer and the electric charge accumulating layer. The semiconductor layer includes at least one protrusion protruding in the second direction toward the electric charge accumulating layer. A position in the first direction of the protrusion is inside with respect to corner portions at both ends in the first direction of a surface opposed to the semiconductor layer in the electric charge accumulating layer.

7 Claims, 27 Drawing Sheets

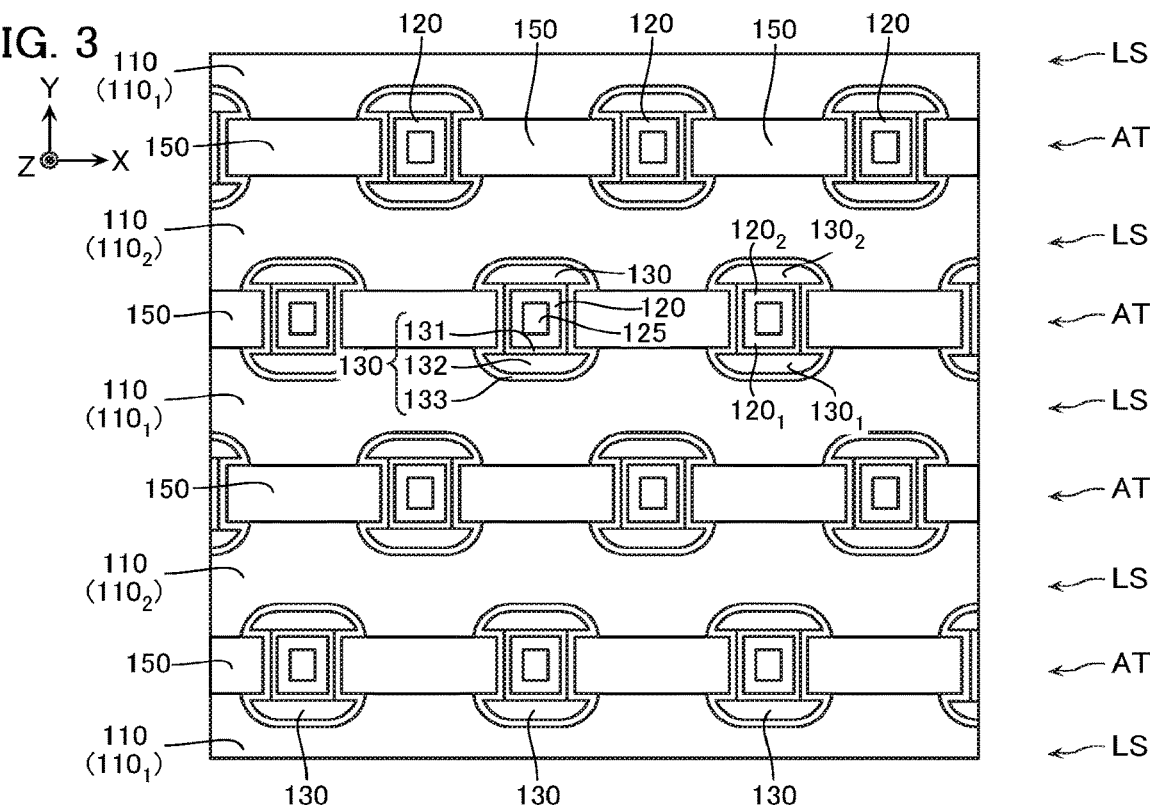
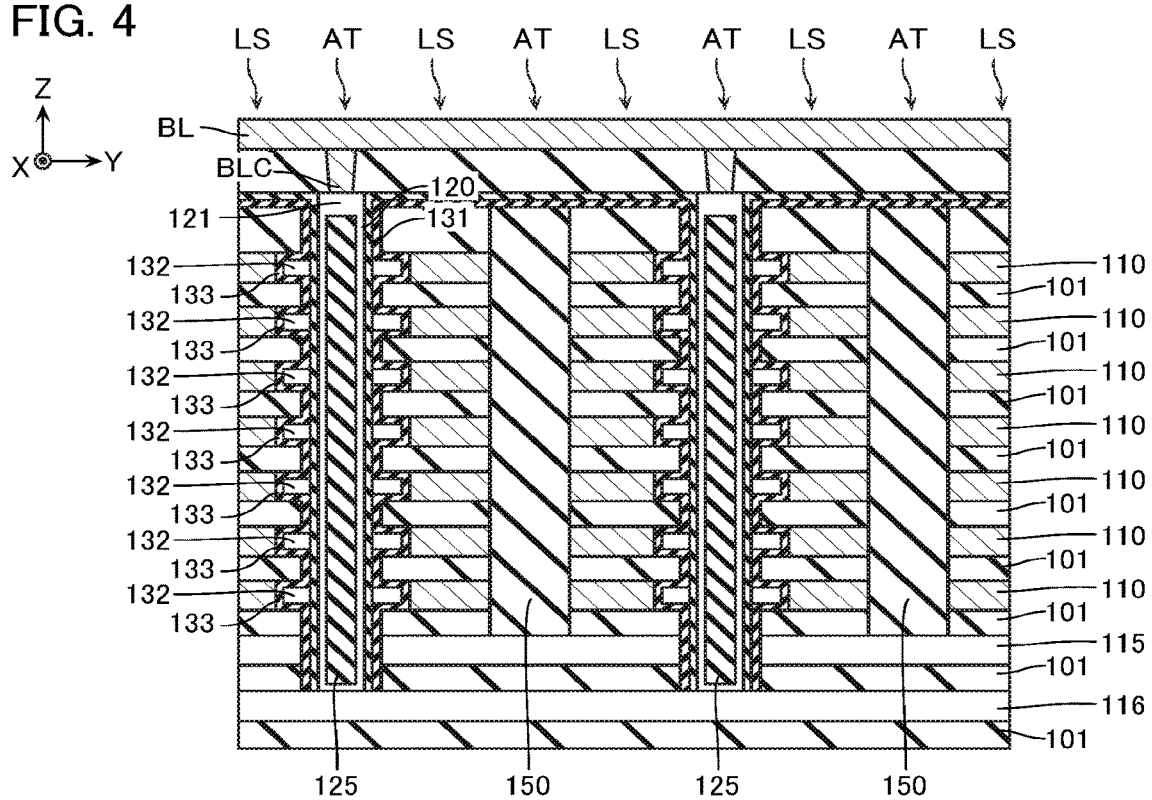

SEMICONDUCTOR MEMORY DEVICE

CROSS-REFERENCE TO RELATED APPLICATIONS

This application is based upon and claims the benefit of Japanese Patent Application No. 2022-042299, filed on Mar. 17, 2022, the entire contents of which are incorporated herein by reference.

BACKGROUND

Field

Embodiments described herein relate generally to a semiconductor memory device.

Description of the Related Art

There has been known a semiconductor memory device including a substrate, a plurality of gate electrodes stacked in a direction intersecting with a surface of this substrate, a semiconductor layer opposed to these plurality of gate electrodes, and a gate insulating layer disposed between the gate electrodes and the semiconductor layer. The gate insulating layer includes a memory unit configured to store data, for example, an insulating electric charge accumulating portion of silicon nitride ($Si_3N_4$) or the like, a conductive electric charge accumulating portion, such as a floating gate, or the like.

BRIEF DESCRIPTION OF THE DRAWINGS

FIG. 3 is a schematic cross-sectional view of the semiconductor memory device;

FIG. 4 is a schematic cross-sectional view of the semiconductor memory device;

DETAILED DESCRIPTION

Figure 1:
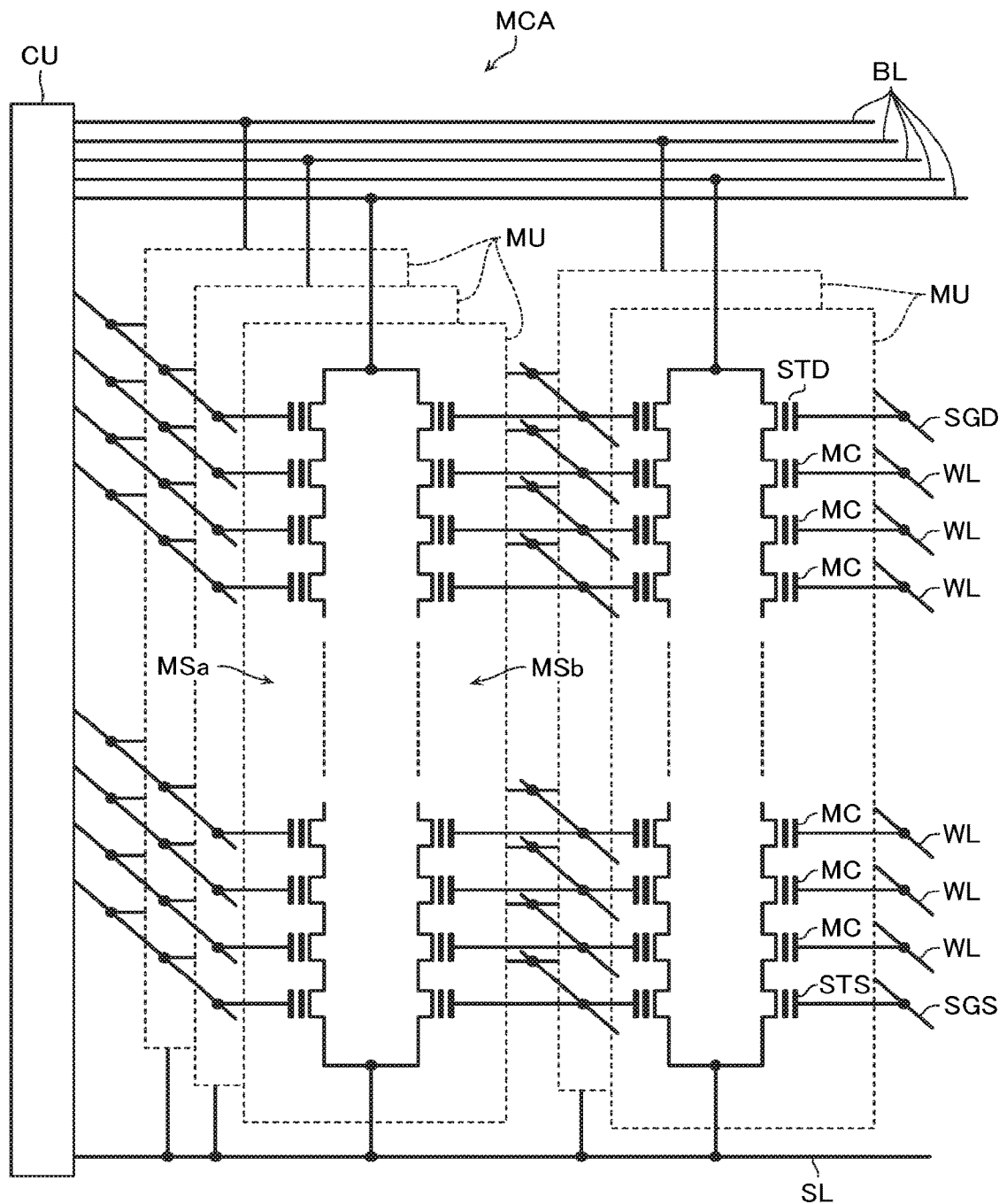
FIG. 1 is a schematic equivalent circuit diagram of a semiconductor memory device according to a first embodiment.

A semiconductor memory device according to one embodiment comprises: a semiconductor layer extending in a first direction; a conductive layer opposed to the semiconductor layer in a second direction intersecting with the first direction; an electric charge accumulating layer disposed between the semiconductor layer and the conductive layer; a first insulating layer disposed between the semiconductor layer and the electric charge accumulating layer; and a second insulating layer disposed between the conductive layer and the electric charge accumulating layer. The semiconductor layer includes at least one protrusion protruding in the second direction toward the electric charge accumulating layer. A position in the first direction of the protrusion is inside with respect to corner portions at both ends in the first direction of a surface opposed to the semiconductor layer in the electric charge accumulating layer.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

In this specification, when it is referred that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in an OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as aside surface and the like.

First Embodiment

[Configuration]

FIG. 1 is a schematic equivalent circuit diagram of a semiconductor memory device according to the first embodiment.

The semiconductor memory device according to the embodiment includes a memory cell array MCA and a control unit CU that controls the memory cell array MCA.

The memory cell array MCA includes a plurality of memory units MU. These plurality of memory units MU each include two electrically independent memory strings MSa, MSb. One ends of these memory strings MSa, MSb are connected to respective drain-side select transistors STD, and connected to a common bit line BL via these drain-side select transistors STD. The other ends of the memory strings MSa, MSb are connected to respective source-side select transistors STS, and connected to a common source line SL via these source-side select transistors STS.

Each of the memory strings MSa, MSb includes a plurality of memory cells MC connected in series. The memory cell MC is afield-effect type transistor including a semiconductor layer, a gate insulating layer, and a gate electrode. The semiconductor layer functions as a channel region. The gate insulating layer includes an electric charge accumulating portion configured to store data. A threshold voltage of the memory cell MC varies corresponding to an electric charge amount in the electric charge accumulating portion. The gate electrode is a part of a word line WL.

The select transistors (STD, STS) are field-effect type transistors including a semiconductor layer, a gate insulating layer, and a gate electrode. The semiconductor layer functions as a channel region. The gate electrode of the drain-side select transistor STD is a part of a drain-side select gate line SGD. The gate electrode of the source-side select transistor STS is a part of a source-side select gate line SGS.

The control unit CU generates voltages necessary for, for example, a read operation, a write operation, and an erase operation, and applies the voltages to the bit lines BL, the source line SL, the word lines WL, and the select gate lines (SGD, SGS). The control unit CU may include, for example, a plurality of transistors and wirings disposed on the same substrate as the memory cell array MCA, and may include a plurality of transistors and wirings disposed on a substrate different from the memory cell array MCA.

Figure 2:
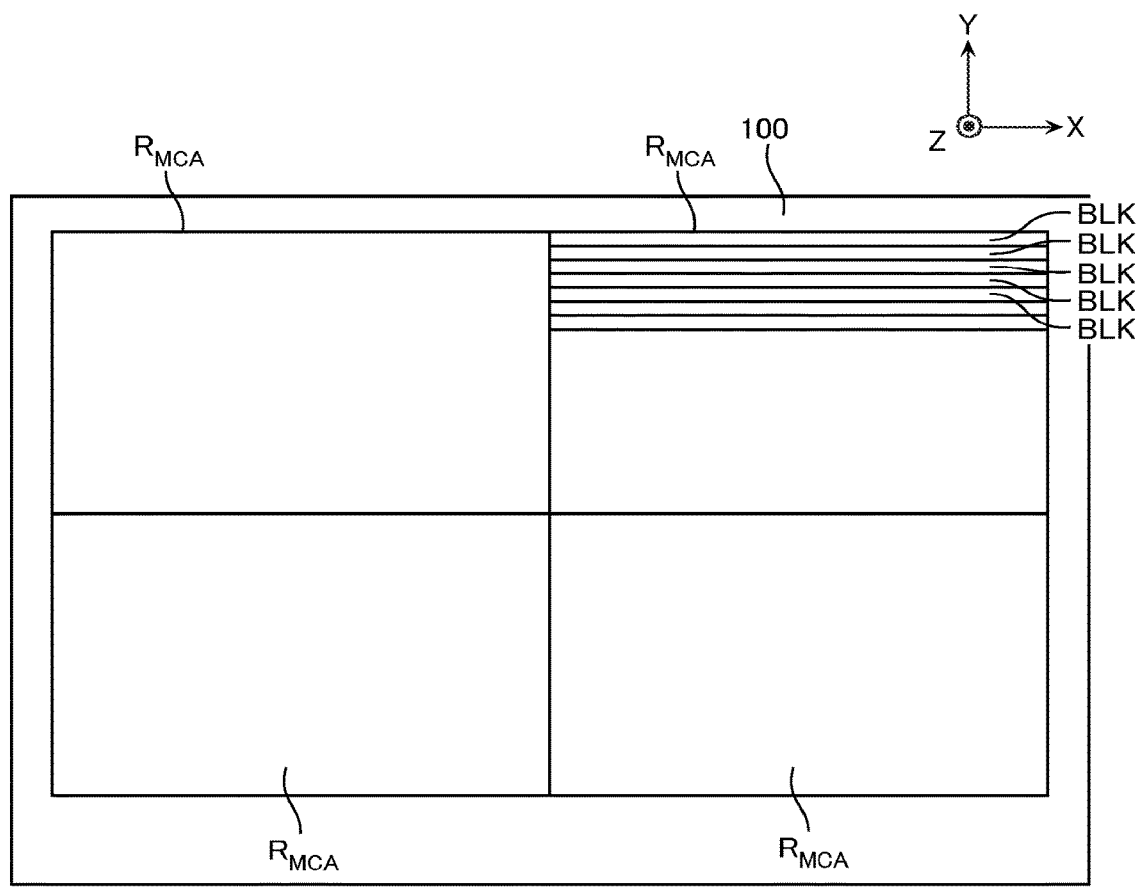
FIG. 2 is a schematic plan view of the semiconductor memory device.

FIG. 2 is a schematic plan view illustrating an exemplary configuration of the semiconductor memory device according to the embodiment.

The semiconductor memory device according to the embodiment includes a semiconductor substrate 100. In the illustrate example, the semiconductor substrate 100 includes four memory cell array regions $R_{MCA}$ arranged in the X-direction and the Y-direction. Each of the memory cell array regions $R_{MCA}$ includes a plurality of memory blocks BLK arranged in the Y-direction. Each of the memory blocks BLK extends in the X-direction.

Figure 5:
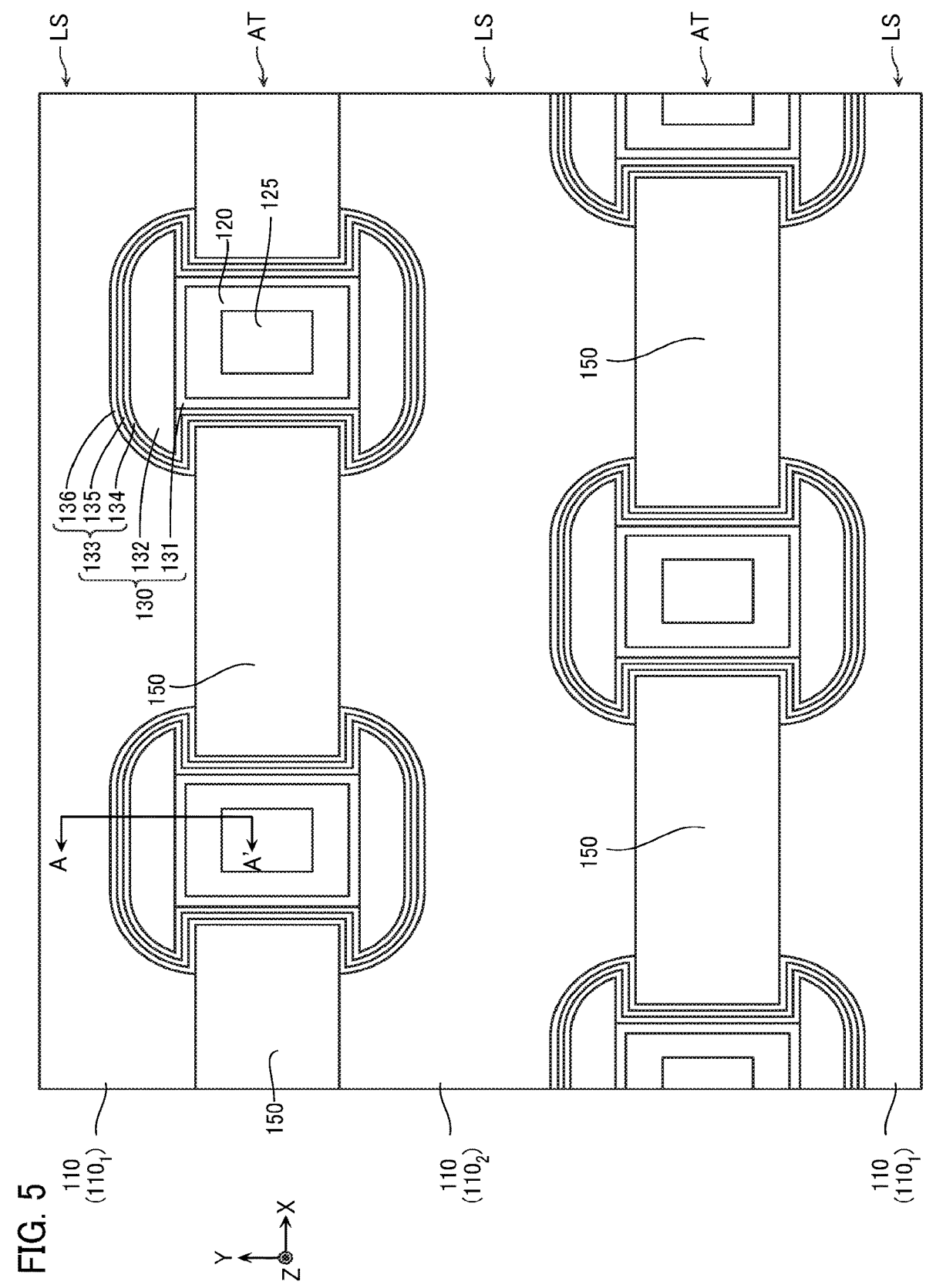
FIG. 5 is a schematic cross-sectional view of the semiconductor memory device.
Figure 6:
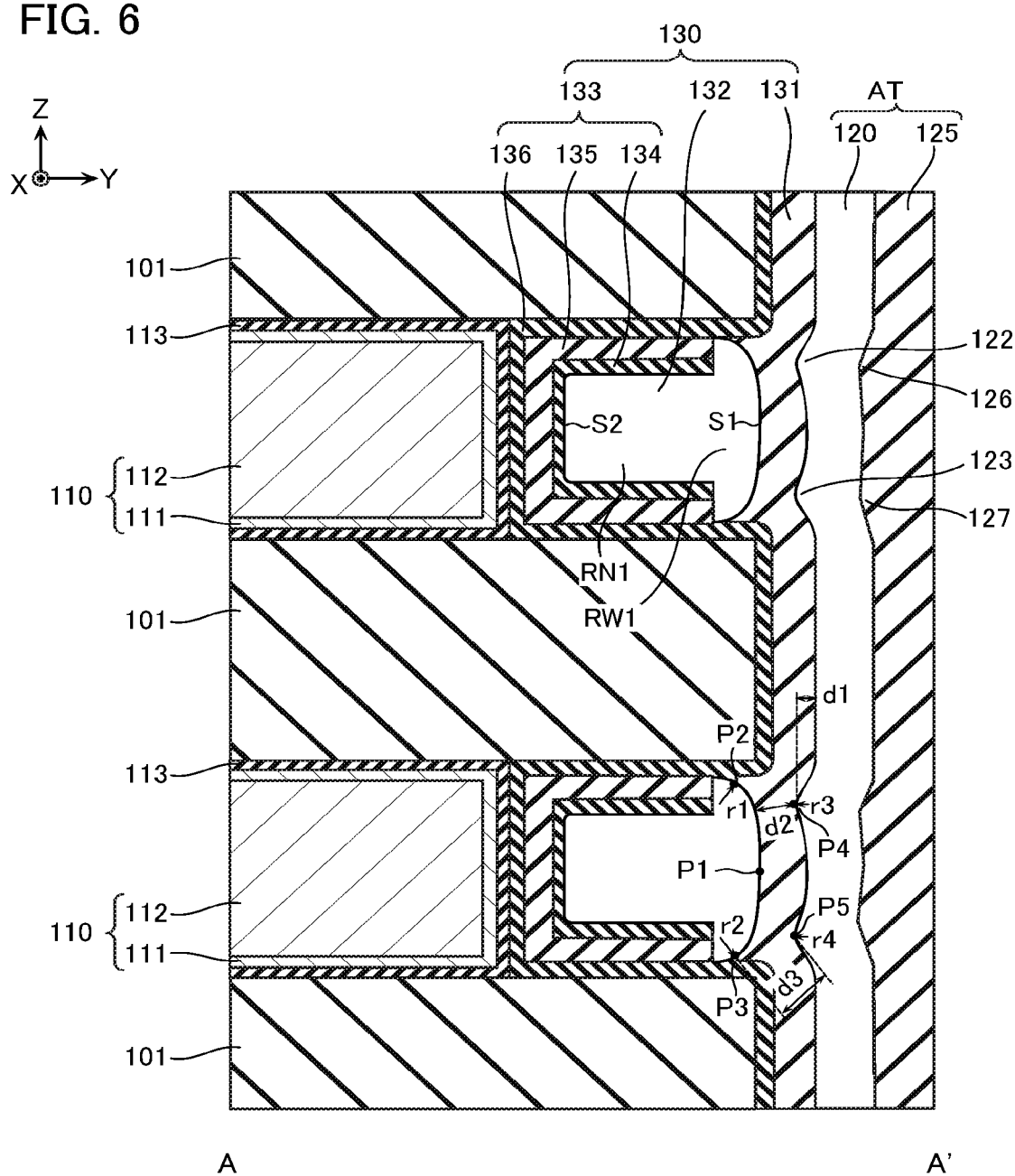
FIG. 6 is a schematic cross-sectional view of the semiconductor memory device.

FIG. 3 is a schematic XY cross-sectional view illustrating a part of the configuration of the memory cell array region $R_{MCA}$. FIG. 4 is a schematic YZ cross-sectional view illustrating a part of the configuration of the memory cell array region $R_{MCA}$. FIG. 5 is a schematic enlarged view illustrating a part of the configuration of FIG. 3. FIG. 6 is a schematic cross-sectional view of the configuration illustrated in FIG. 5 taken along a line A-A' viewed in a direction of arrows.

For example, as illustrated in FIG. 3 and FIG. 4, the semiconductor memory device according to the embodiment includes a plurality of stacked structures LS and a plurality of trench structures AT. The plurality of stacked structures LS are arranged in the Y-direction above the semiconductor substrate 100. The plurality of trench structures AT are each disposed between the plurality of stacked structures LS.

The stacked structure LS includes a plurality of conductive layers 110, a semiconductor layer 115, and a semiconductor layer 116. The plurality of conductive layers 110, the semiconductor layer 115, and the semiconductor layer 116 are stacked in the Z-direction via respective insulating layers 101 of silicon oxide ($SiO_2$) or the like.

The trench structure AT includes a plurality of semiconductor layers 120. The plurality of semiconductor layers 120 extend in the Z-direction, and are arranged in the X-direction via insulating layers 150 of silicon oxide ($SiO_2$) or the like. Between the conductive layers 110 and the semiconductor layers 120, respective gate insulating layers 130 are disposed.

The semiconductor substrate 100 (FIG. 2) includes, for example, single-crystal silicon (Si) or the like. For example, the semiconductor substrate 100 has a double well structure including an n-type impurity layer in an upper surface of the semiconductor substrate and further including a p-type impurity layer in this n-type impurity layer. On a surface of the semiconductor substrate 100, for example, a transistor, a wiring, and the like constituting at least apart of the control unit CU (FIG. 1) may be disposed.

The conductive layer 110 (FIG. 4) extends in the X-direction. For example, as illustrated in FIG. 6, the conductive layer 110 is a stacked film including a barrier conductive layer 111 of titanium nitride (TiN) or the like and a metal film 112 of tungsten (W) or the like. Each of these conductive layers 110 functions as the word line WL and the gate electrode of the memory cell MC (FIG. 1). A part of those disposed in the upper side among these conductive layers 110 function as the drain-side select gate line SGD and the gate electrode of the drain-side select transistor STD (FIG. 1). As illustrated in FIG. 6, an insulating metal oxide layer 113 of alumina (AlO) or the like may be disposed so as to cover an upper surface, a lower surface, and a part of a side surface of the conductive layer 110.

The semiconductor layer 115 (FIG. 4) extends in the X-direction. The semiconductor layer 115 is, for example, a semiconductor layer containing polycrystalline silicon (Si) or the like. The semiconductor layer 115 functions as the source-side select gate line SGS and the gate electrode of the source-side select transistor STS (FIG. 1).

The semiconductor layer 116 extends in the X-direction. The semiconductor layer 116 is, for example, a semiconductor layer containing polycrystalline silicon (Si) or the like. The semiconductor layer 116 functions as a part of the source line SL.

In the following description, when focusing on the two stacked structures LS adjacent in the Y-direction, a plurality of the conductive layers 110 included in one stacked structure LS are referred to as conductive layers $110_1$ (FIG. 3) in some cases. A plurality of the conductive layers 110 included in the other stacked structure LS are referred to as conductive layers $110_2$ (FIG. 3) in some cases. The conductive layers $110_1$ are electrically independent from the conductive layers $110_2$. Therefore, different voltages can be applied to the conductive layers $110_1$ and the conductive layers $110_2$. The conductive layers $110_1$ function as gate electrodes of the memory cells MC included in the memory string MSa, or a gate electrode of the drain-side select transistor STD included in the memory string MSa. The conductive layers $110_2$ function as gate electrodes of the memory cells MC included in the memory string MSb, or a gate electrode of the drain-side select transistor STD included in the memory string MSb.

The semiconductor layer 120 includes, for example, non-doped polycrystalline silicon (Si) or the like. The semiconductor layer 120 has an approximately closed-end square cylindrical shape, and includes an insulating layer 125 of silicon oxide ($SiO_2$) or the like in the center portion. In the following description, in the semiconductor layer 120, a region opposed to the plurality of conductive layers $110_1$ is referred to as a first region $120_1$ (FIG. 3), and a region opposed to the plurality of conductive layers $110_2$ is referred to as a second region $120_2$ (FIG. 3) in some cases. The first region $120_1$ functions as channel regions of the plurality of memory cells MC, and channel regions of the drain-side select transistor STD and the source-side select transistor STS in the memory string MSa (FIG. 1). The second region $120_2$ functions as channel regions of the plurality of memory cells MC, and channel regions of the drain-side select transistor STD and the source-side select transistor STS in the memory string MSb (FIG. 1).

For example, as illustrated in FIG. 4, an impurity region 121 containing N-type impurities, such as phosphorus (P), is disposed at an upper end of the semiconductor layer 120. The impurity region 121 is connected to the bit line BL extending in the Y-direction via a bit line contact BLC of tungsten (W) or the like.

In the illustrate example, the lower end of the semiconductor layer 120 is connected to the semiconductor layer 116. In this case, the semiconductor layer 116 functions as apart of the source line SL (FIG. 1). The semiconductor layer 120 is electrically connected to the control unit CU via the semiconductor layer 116. However, this configuration is merely an example, and the specific configuration can be appropriately adjusted. For example, the lower end of the semiconductor layer 120 may be connected to a wiring, a semiconductor layer, or the like other than the semiconductor layer 116.

The gate insulating layer 130 includes a tunnel insulating layer 131 (first insulating layer), an electric charge accumulating layer 132, and a block insulating layer 133 (second insulating layer) disposed from the semiconductor layer 120 side toward the conductive layer 110 side.

The tunnel insulating layer 131 includes, for example, an insulating layer of silicon oxide ($SiO_2$), silicon oxynitride (SiON), or the like. For example, as illustrated in FIG. 4, the tunnel insulating layer 131 may extend in the Z-direction along the outer peripheral surface of the semiconductor layer 120. The tunnel insulating layer 131 may be disposed at each side surface in the Y-direction of the electric charge accumulating layer 132.

The electric charge accumulating layer 132 is, for example, a floating gate of polycrystalline silicon or the like containing N-type impurities, such as phosphorus (P), or P-type impurities, such as boron (B). However, the electric charge accumulating layer 132 may be an insulating electric charge accumulating portion containing silicon nitride (SiN) or the like.

As illustrated in FIG. 6, the electric charge accumulating layer 132 includes a wide-width portion RW1 and a narrow-width portion RN1 in the YZ cross section. The wide-width portion RW1 is disposed at a position closer to the semiconductor layer 120 than the narrow-width portion RN1. The wide-width portion RW1 includes an opposed surface S1 opposed to the semiconductor layer 120. The narrow-width portion RN1 includes an opposed surface S2 opposed to the conductive layer 110. The opposed surface S1 has a curved shape that curves from a center P1 in the Z-direction toward both ends in the Z-direction in a direction gradually separating from the semiconductor layer 120. Here, in the opposed surface S1, portions at which curvature radii are the smallest between the center P1 in the Z-direction and an upper end and a lower end in the Z-direction are defined as corner portions P2, P3.

On the other hand, the semiconductor layer 120 includes two protrusions 122, 123 protruding in the Y-direction toward the electric charge accumulating layer 132 in the surface opposed to the electric charge accumulating layer 132. Any number of the protrusions 122, 123 may be disposed insofar as the number is one or more. Protrusion amounts d1 of the semiconductor layer 120 from a portion the farthest in the Y-direction from the electric charge accumulating layer 132 to distal end portions P4, P5 of the protrusions 122, 123 may be 1 nm or more, for example, when the tunnel insulating layer 131 is approximately 6 nm. The protrusion amounts d1 of the protrusions 122, 123 may be, for example, 1 nm or more and 2 nm or less. Positions in the Z-direction of the distal end portions P4, P5 of the protrusions 122, 123 are between positions in the Z-direction of the corner portions P2, P3 of the electric charge accumulating layer 132. Curvature radii r3, r4 of the distal end portions P4, P5 of the protrusions 122, 123 are smaller than curvature radii r1, r2 of the corner portions P2, P3 of the electric charge accumulating layer 132. Shortest distances d2 between the distal end portions P4, P5 of the protrusions 122, 123 and the electric charge accumulating layer 132 are the shortest distance between the semiconductor layer 120 and the electric charge accumulating layer 132. The shortest distances d2 between the distal end portions P4, P5 of the protrusions 122, 123 and the electric charge accumulating layer 132 are smaller than distances d3 between the distal end portions P4, P5 of the protrusions 122, 123 and the corner portions P2, P3 of the electric charge accumulating layer 132. The distance d3 may be 4/3 times or more of the shortest distance d2.

For example, as illustrated in FIG. 5 and FIG. 6, the block insulating layer 133 includes an insulating layer 134, a high dielectric constant layer 135, and an insulating layer 136.

The insulating layer 134 is, for example, a stacked film containing silicon oxide ($SiO_2$) or the like, or containing titanium nitride (TiN) and silicon oxide ($SiO_2$). As illustrated in FIG. 5, the insulating layer 134 is disposed so as to cover a part of the outer peripheral surface of the electric charge accumulating layer 132 in the XY cross section. As illustrated in FIG. 6, the insulating layer 134 covers the upper surface and the lower surface of the narrow-width portion RN1 and the side surface in the conductive layer 110 side of the narrow-width portion RN1 in the YZ cross section. An end surface in the semiconductor layer 120 side in the Y-direction of the insulating layer 134 is in contact with the wide-width portion RW1.

The high dielectric constant layer 135 contains, for example, an insulating material having a comparatively high relative dielectric constant described later. As illustrated in FIG. 5, the high dielectric constant layer 135 is disposed so as to cover a part of the outer peripheral surface of the electric charge accumulating layer 132 via the insulating layer 134 in the XY cross section. As illustrated in FIG. 6, the high dielectric constant layer 135 covers the upper surface and the lower surface of the insulating layer 134 and the side surface in the conductive layer 110 side of the insulating layer 134 in the YZ cross section. An end surface in the semiconductor layer 120 side in the Y-direction of the high dielectric constant layer 135 is in contact with the wide-width portion RW1. That is, the end surfaces in the semiconductor layer 120 side in the Y-direction of the high dielectric constant layer 135 and the insulating layer 134 are disposed at positions similar in the Y-direction.

The material of the high dielectric constant layer 135 preferably contains, for example, hafnium silicate (HfSiO), hafnium oxide (HfO), zirconium oxide (ZrO), yttrium oxide (YO), lanthanum oxide (LaO), aluminum oxide (AlO), or the like. The high dielectric constant layer 135 may contain at least one element selected from the group consisting of carbon (C), nitrogen (N), fluorine (F), aluminum (Al), chlorine (Cl), and silicon (Si). The high dielectric constant layer 135 may contain a material other than the above-described materials. In this case, the relative dielectric constant of the material contained in the high dielectric constant layer 135 is preferably higher than the relative dielectric constant of silicon nitride (SiN).

The insulating layer 136 includes, for example, an insulating layer of silicon oxide ($SiO_2$) or the like. As illustrated in FIG. 5, the insulating layer 136 is disposed so as to cover a part of the outer peripheral surface of the electric charge accumulating layer 132 via the high dielectric constant layer 135 in the XY cross section. As illustrated in FIG. 6, the insulating layer 136 covers the upper surfaces and the lower surfaces of the high dielectric constant layer 135 and the wide-width portion RW1, and the side surface in the conductive layer 110 side of the high dielectric constant layer 135 in the YZ cross section. The insulating layer 136 and the wide-width portion RW1 may be disposed so as to be directly in contact with one another in the Z-direction.

As illustrated in FIG. 6, when focusing on the two electric charge accumulating layers 132 adjacent in the Z-direction, the wide-width portion RW1 of one electric charge accumulating layer 132 is opposed to the wide-width portion RW1 of the other electric charge accumulating layer 132 without via any of the high dielectric constant layers 135 arranged in the Z-direction. That is, the high dielectric constant layer 135 is not disposed between the wide-width portions RW1 of these two electric charge accumulating layers 132.

[Manufacturing Method]

Next, with reference to FIG. 7 to FIG. 32, a method of manufacturing a semiconductor memory device according to the embodiment will be described. FIG. 7, FIG. 9, FIG. 11, FIG. 13, FIG. 15, FIG. 17, FIG. 19, FIG. 21, and FIG. 23 are schematic XY cross-sectional views for describing the manufacturing method, and each correspond to the part illustrated in FIG. 3. FIG. 8, FIG. 10, FIG. 12, FIG. 14, FIG. 16, FIG. 18, FIG. 20, FIG. 22, and FIG. 24 are schematic YZ cross-sectional views for describing the manufacturing method, and each correspond to the part illustrated in FIG. 4. FIG. 25 to FIG. 32 are schematic cross-sectional views for describing the manufacturing method, and each correspond to the part illustrated in FIG. 6.

Figure 7:
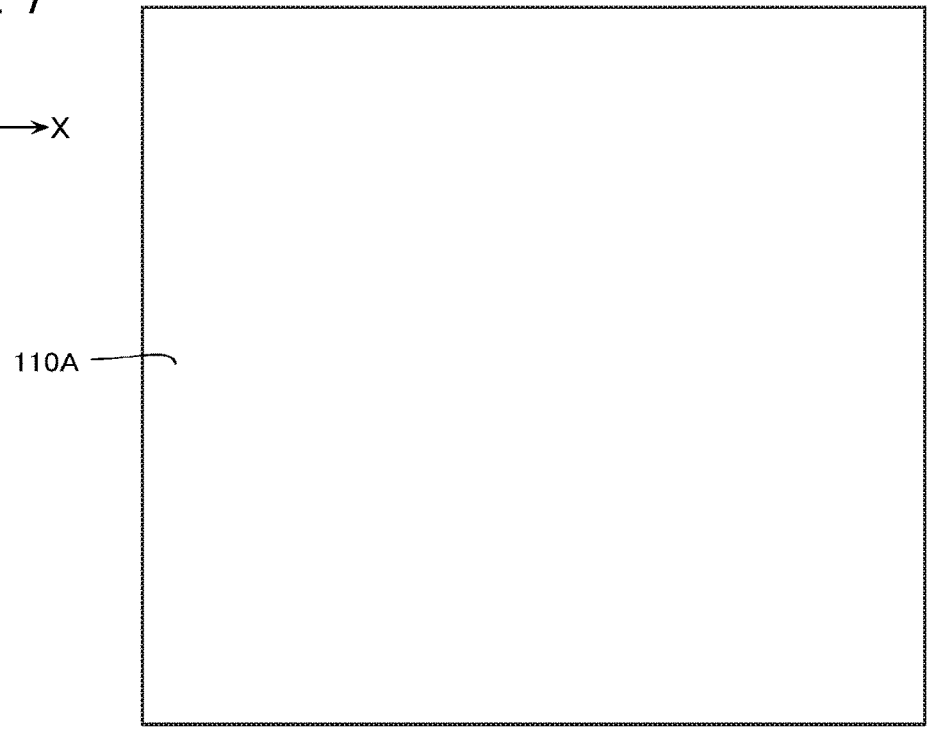
FIG. 7 is a schematic cross-sectional view illustrating a method of manufacturing the semiconductor memory device.
Figure 8:
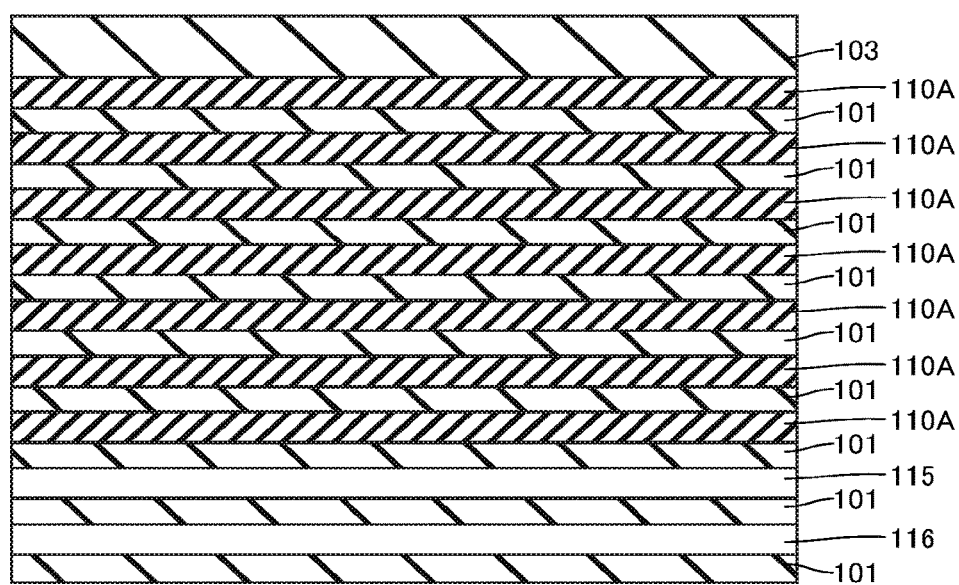
FIG. 8 is a schematic cross-sectional view illustrating the manufacturing method.

As illustrated in FIG. 7 and FIG. 8, in the manufacturing method, a plurality of insulating layers 101 are stacked in alternation with the semiconductor layer 116, the semiconductor layer 115, and sacrifice layers 110A above the semiconductor substrate 100 (not illustrated), and an insulating layer 103 is formed thereon. The sacrifice layer 110A contains silicon nitride (SiN) or the like. The insulating layer 103 contains silicon oxide ($SiO_2$) or the like. This process is performed by a method such as Chemical Vapor Deposition (CVD).

Figure 9:
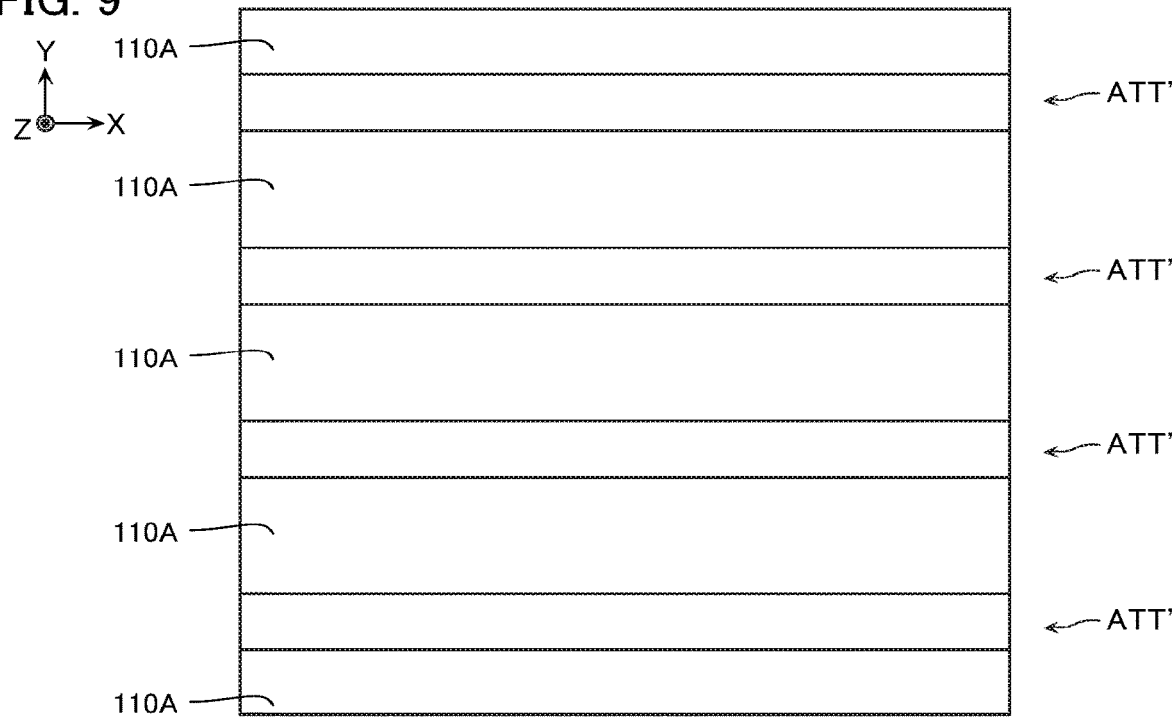
FIG. 9 is a schematic cross-sectional view illustrating the manufacturing method.
Figure 10:
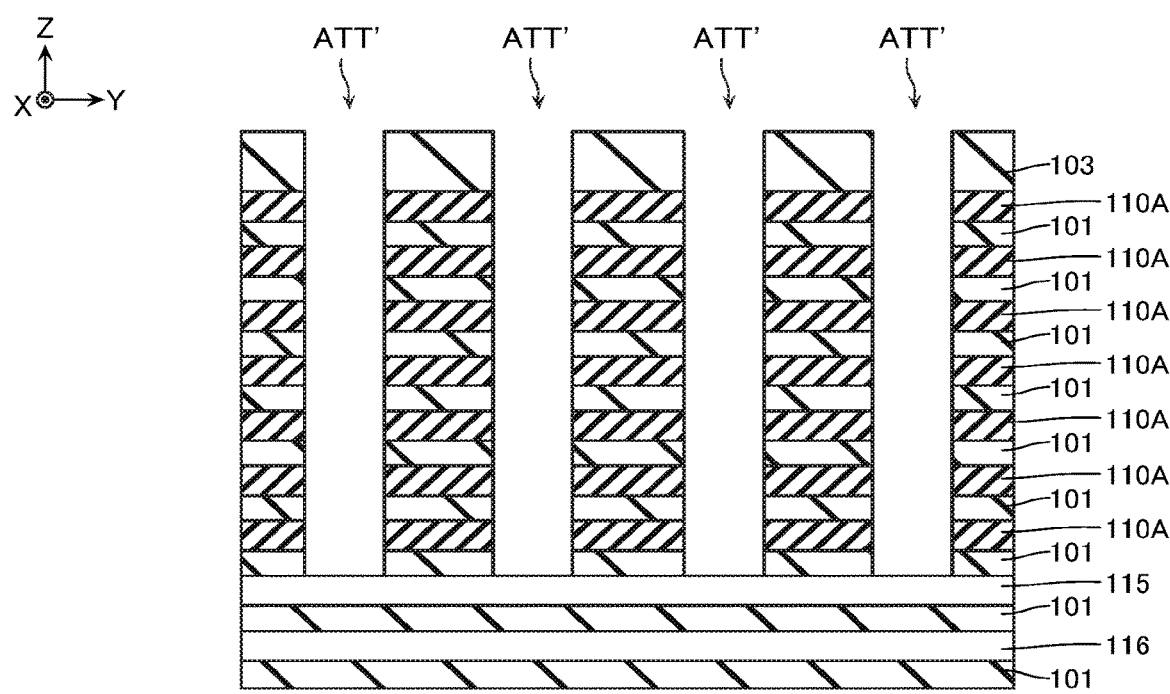
FIG. 10 is a schematic cross-sectional view illustrating the manufacturing method.

Next, as illustrated in FIG. 9 and FIG. 10, trenches ATT' are formed in a stacked structure including the insulating layer 103, the insulating layers 101, and the sacrifice layers 110A. In this process, for example, an insulating layer having openings at parts corresponding to the trenches ATT' is formed on an upper surface of the structure illustrated in FIG. 8, and performs Reactive Ion Etching (RIE) or the like using this insulating layer as a mask. As illustrated in FIG. 9, the trenches ATT' extend in the X-direction. As illustrated in FIG. 10, the trenches ATT' extend in the Z-direction, and penetrate the insulating layer 103, the plurality of insulating layers 101, and the plurality of sacrifice layers 110A, thus separating these configurations in the Y-direction.

Figure 11:
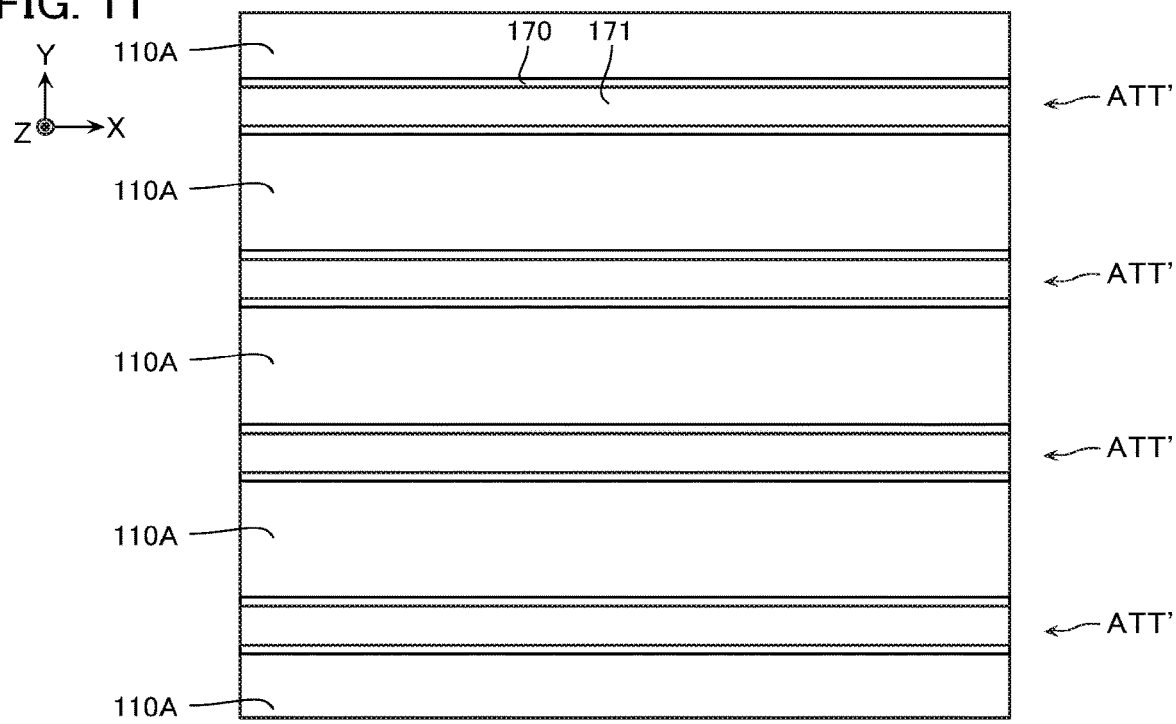
FIG. 11 is a schematic cross-sectional view illustrating the manufacturing method.
Figure 12:
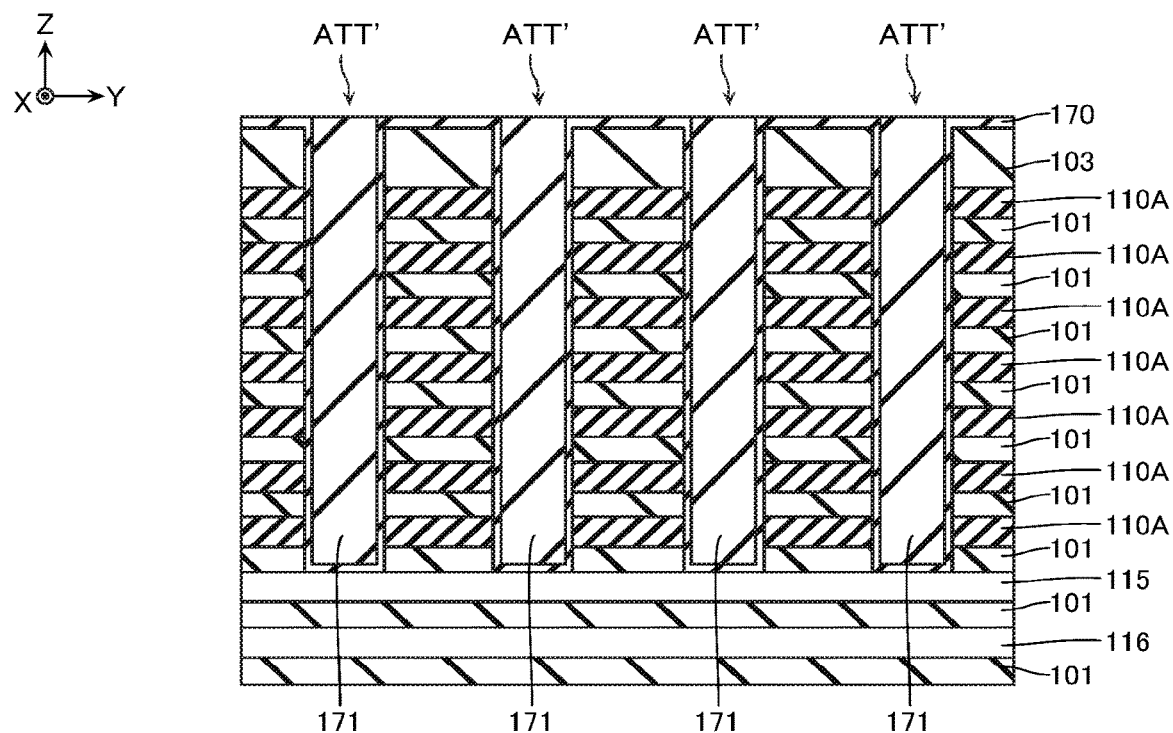
FIG. 12 is a schematic cross-sectional view illustrating the manufacturing method.

Next, as illustrated in FIG. 11 and FIG. 12, an insulating layer 170 is formed on an upper surface of the insulating layer 103, and bottom surfaces and side surfaces of the trenches ATT'. The insulating layer 170 contains silicon oxide ($SiO_2$) or the like. This process is performed by the method, such as CVD. A carbon film 171 filling the trenches ATT' is formed on an upper surface of the insulating layer 170. The carbon film 171 is formed by, for example, spin coating of a coating type carbon material. Further, upper portion of the carbon film 171 is removed to a position the same as the upper surface of the insulating layer 170. The carbon film 171 is removed by RIE or the like.

Figure 13:
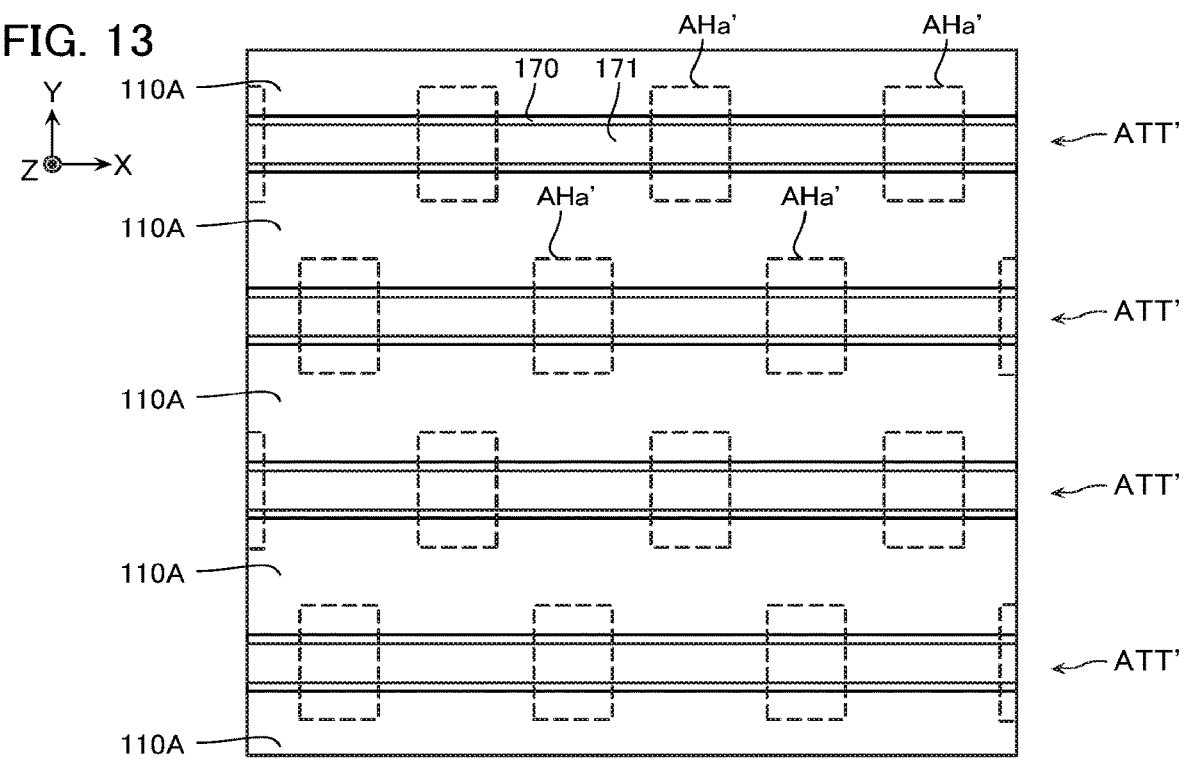
FIG. 13 is a schematic cross-sectional view illustrating the manufacturing method.
Figure 14:
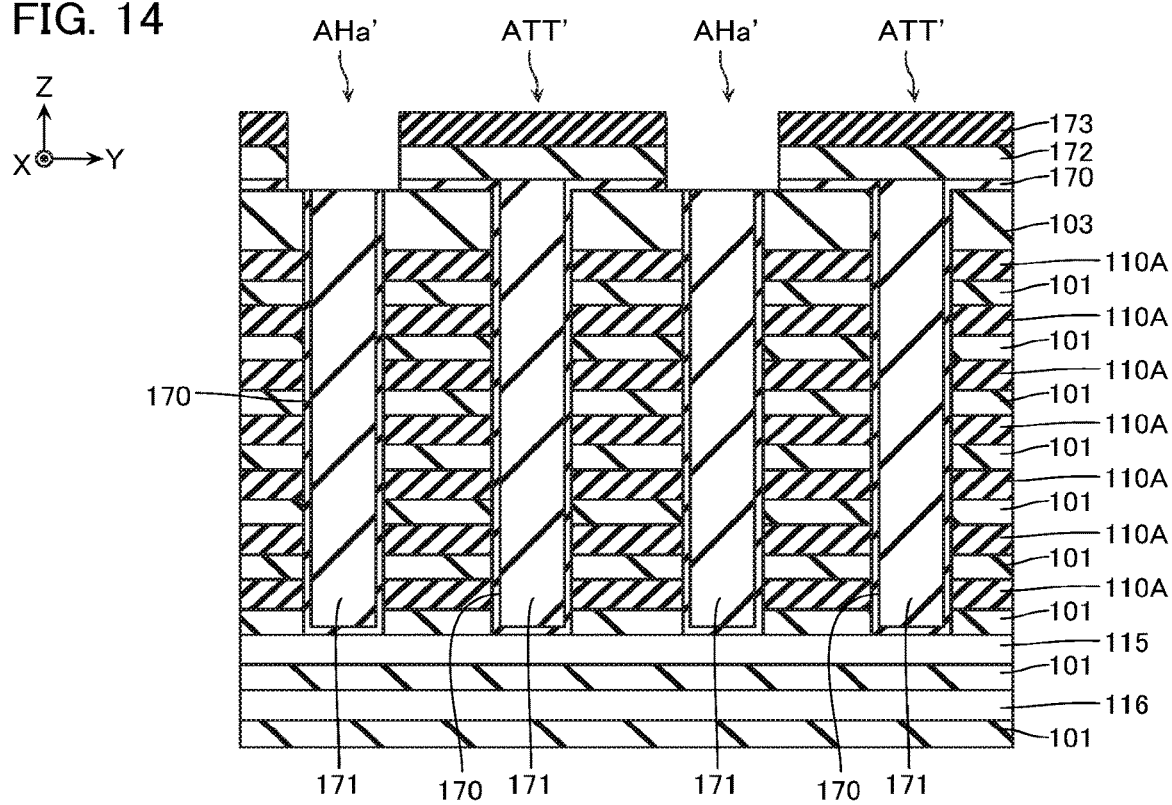
FIG. 14 is a schematic cross-sectional view illustrating the manufacturing method.

Next, as illustrated in FIG. 13 and FIG. 14, a hard mask 172 and a resist 173 are formed on an upper surface of the structure illustrated in FIG. 12. The hard mask 172 contains silicon oxide ($SiO_2$) or the like. The hard mask 172 is formed by CVD or the like. The resist 173 is formed by spin coating or the like of a resist material. Openings AHa' are formed using the resist 173 as a mask. The openings AHa' penetrate the hard mask 172 and the insulating layer 170, and exposes the carbon film 171. The openings AHa' are formed by, for example, the method of photolithography and RIE, or the like.

Figure 15:
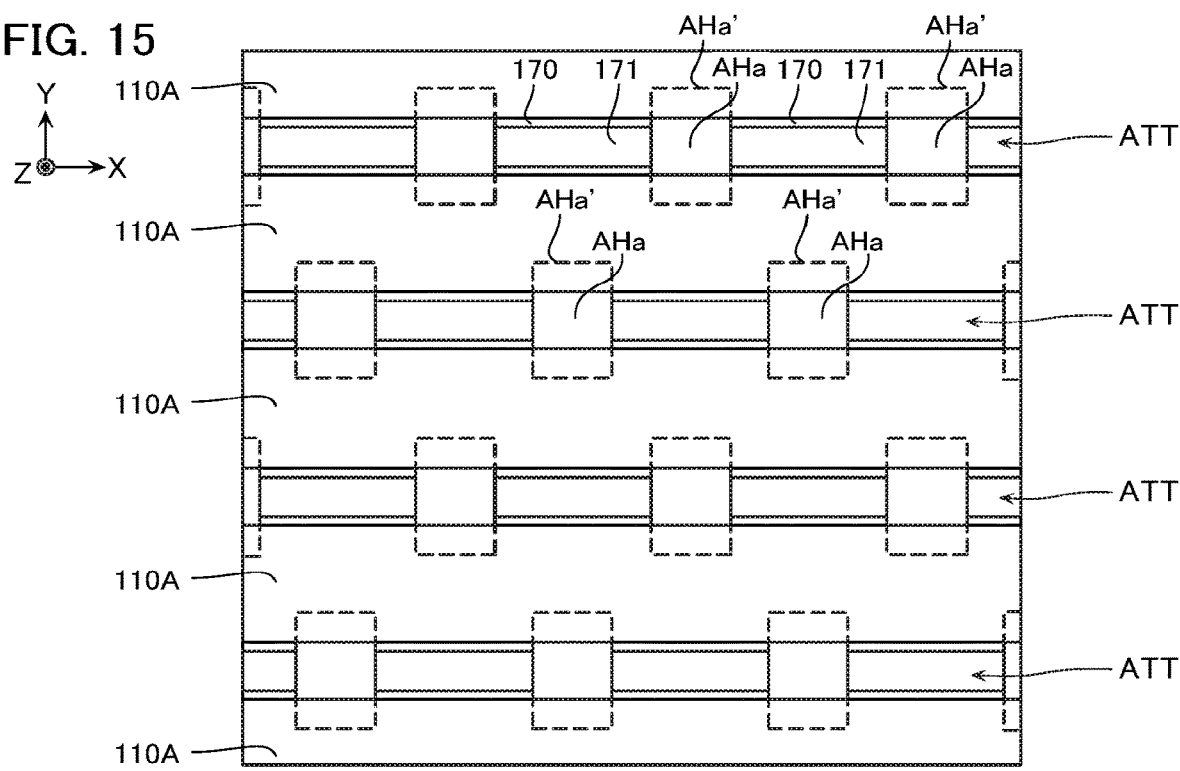
FIG. 15 is a schematic cross-sectional view illustrating the manufacturing method.
Figure 16:
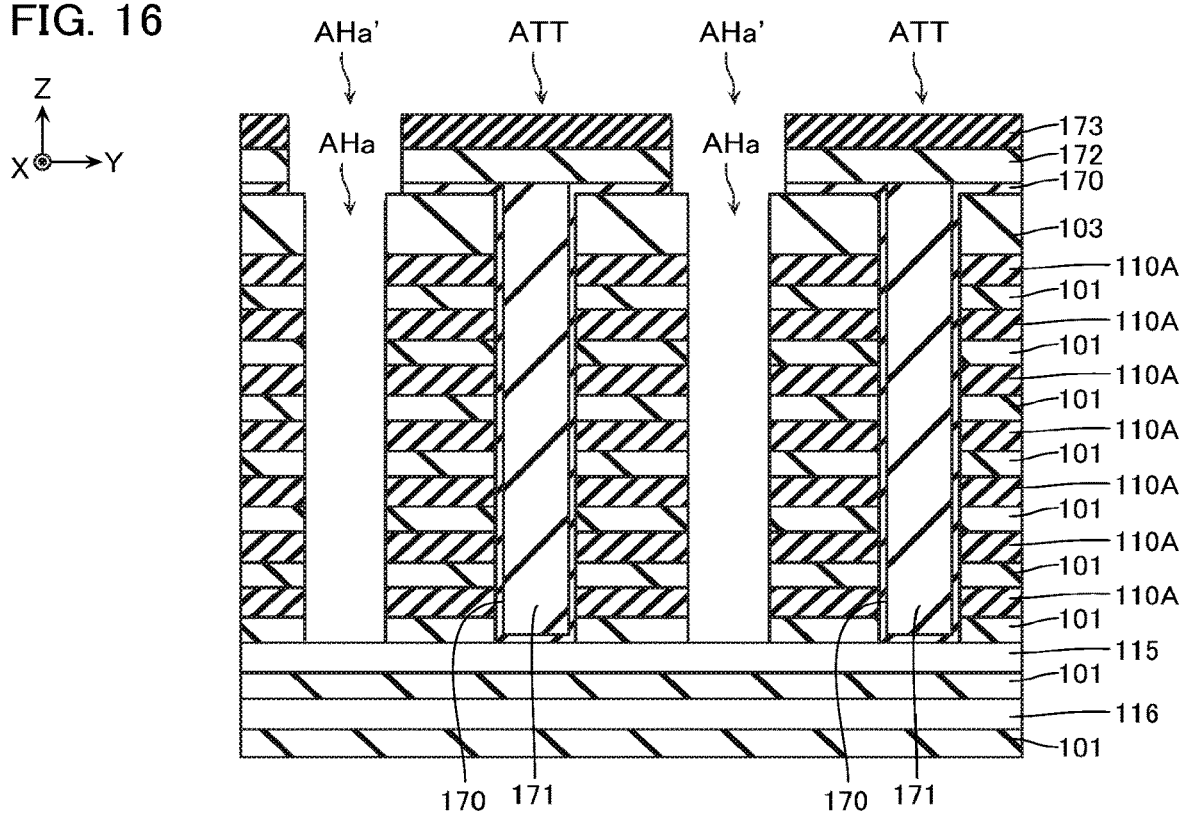
FIG. 16 is a schematic cross-sectional view illustrating the manufacturing method.

Next, as illustrated in FIG. 15 and FIG. 16, parts disposed at positions corresponding to the openings AHa' in the carbon film 171 and the insulating layer 170 are removed, thus forming openings AHa. The process of removing the carbon film 171 is performed by ashing or the like. The process of removing the insulating layer 170 is performed by chemical dry etching or the like. Hereinafter, in the trench ATT', a plurality of parts separated by a plurality of openings AHa arranged in the X-direction are each referred to as a trench ATT.

Figure 17:
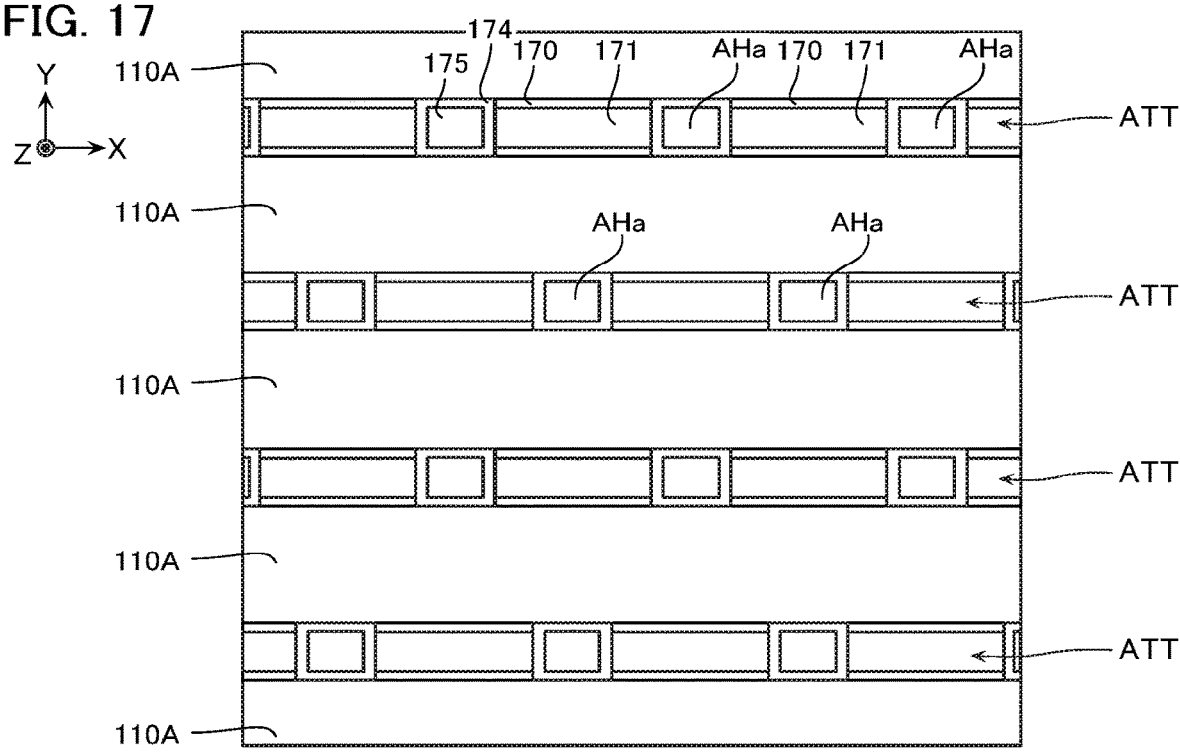
FIG. 17 is a schematic cross-sectional view illustrating the manufacturing method.
Figure 18:
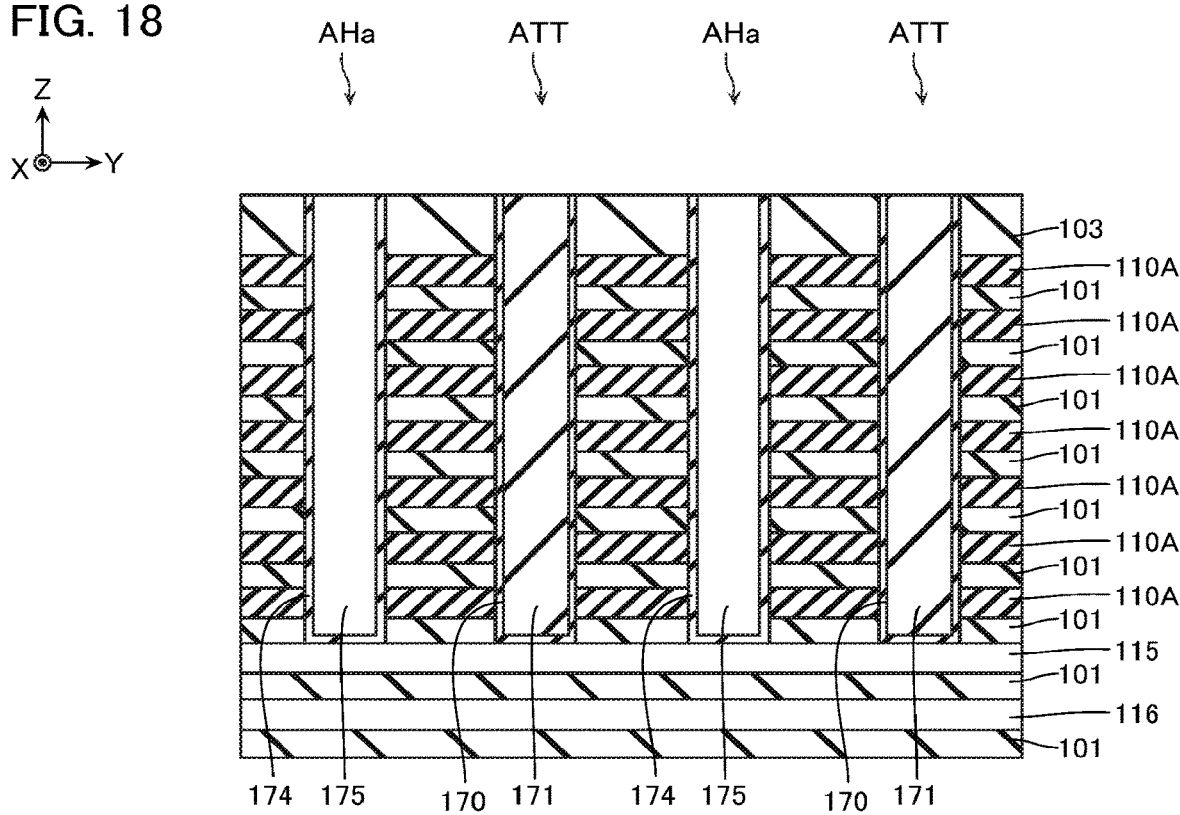
FIG. 18 is a schematic cross-sectional view illustrating the manufacturing method.

Next, as illustrated in FIG. 17 and FIG. 18, the resist 173, the hard mask 172, and the insulating layer 170 are removed from the upper surface of the structure illustrated in FIG. 16. This process is performed by ashing, RIE, or the like.

Insulating layers 174 of silicon oxide ($SiO_2$) or the like are formed on bottom surfaces and side surfaces of the openings AHa. Semiconductor layers 175 of amorphous silicon (Si) or the like filling the openings AHa are formed on upper surfaces of the insulating layers 174. The insulating layers 174 and the semiconductor layers 175 are formed by the method such as CVD. Upper portions of the insulating layers 174 and the semiconductor layers 175 are removed to positions the same as that of the upper surface of the insulating layer 103. The insulating layers 174 and the semiconductor layers 175 are removed by RIE or the like.

Figure 19:
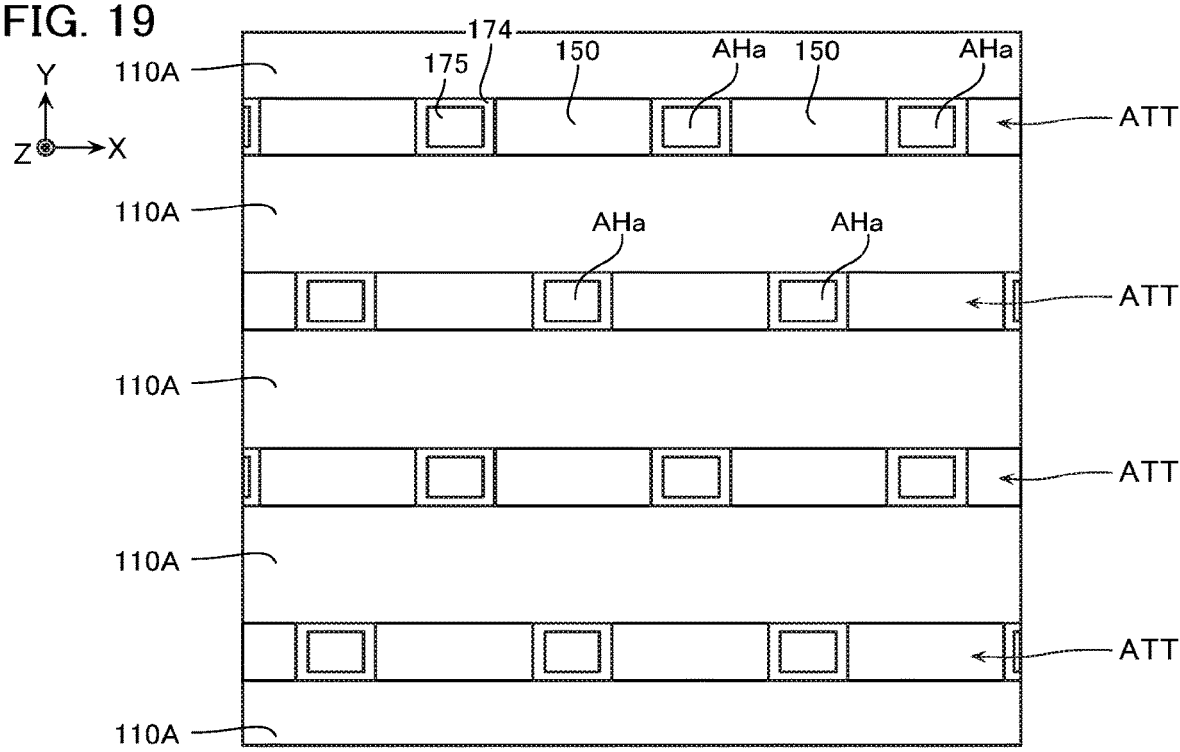
FIG. 19 is a schematic cross-sectional view illustrating the manufacturing method.
Figure 20:
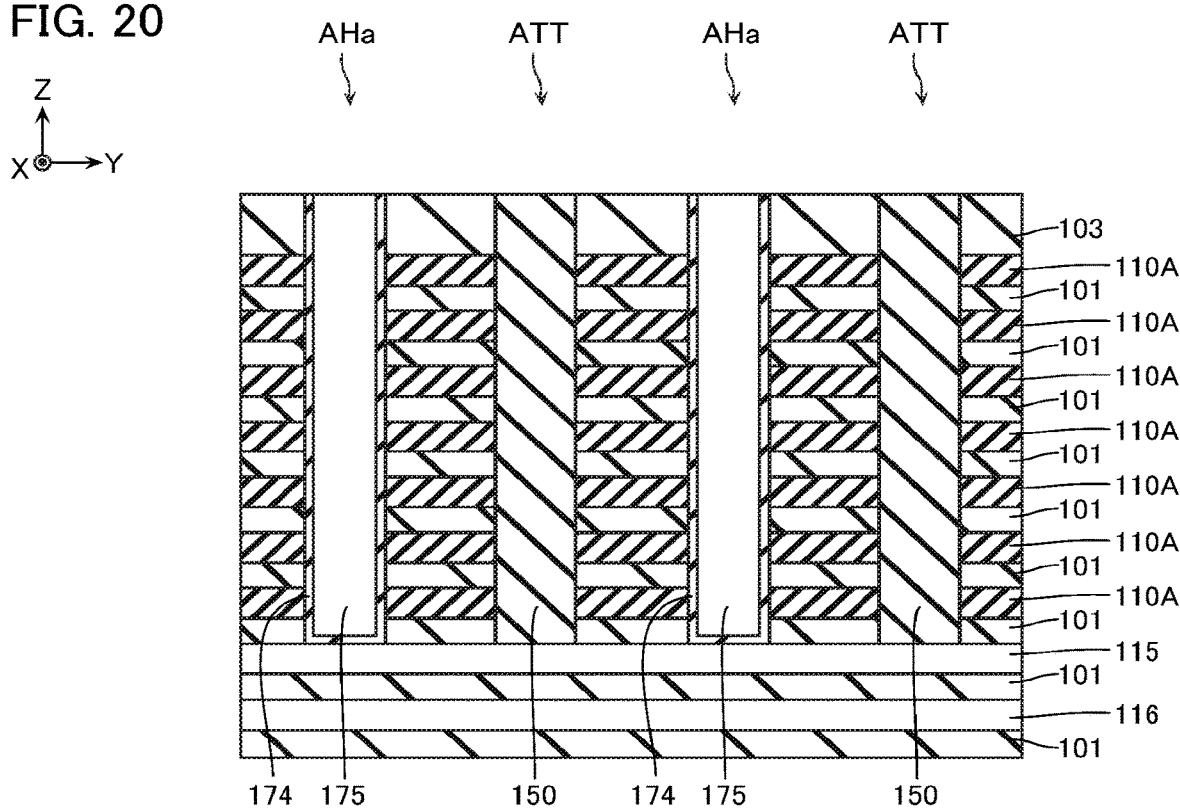
FIG. 20 is a schematic cross-sectional view illustrating the manufacturing method.

Next, as illustrated in FIG. 19 and FIG. 20, the carbon films 171 and the insulating layers 170 are removed from insides of the trenches ATT. This process is performed by ashing, RIE, or the like. Insulating layers 150 are formed inside the trenches ATT, and upper surfaces of the insulating layers 150 are remove to the position of the upper surface of the insulating layer 103. This process is performed by CVD, RIE, or the like.

Figure 21:
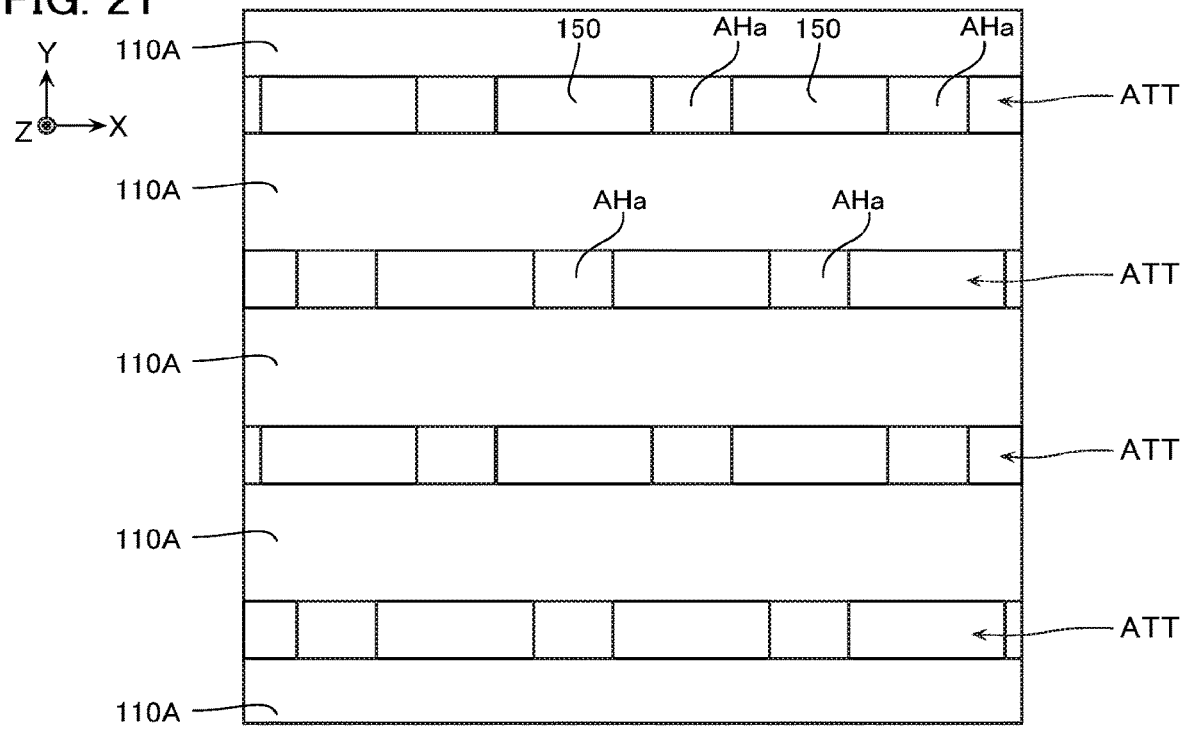
FIG. 21 is a schematic cross-sectional view illustrating the manufacturing method.
Figure 22:
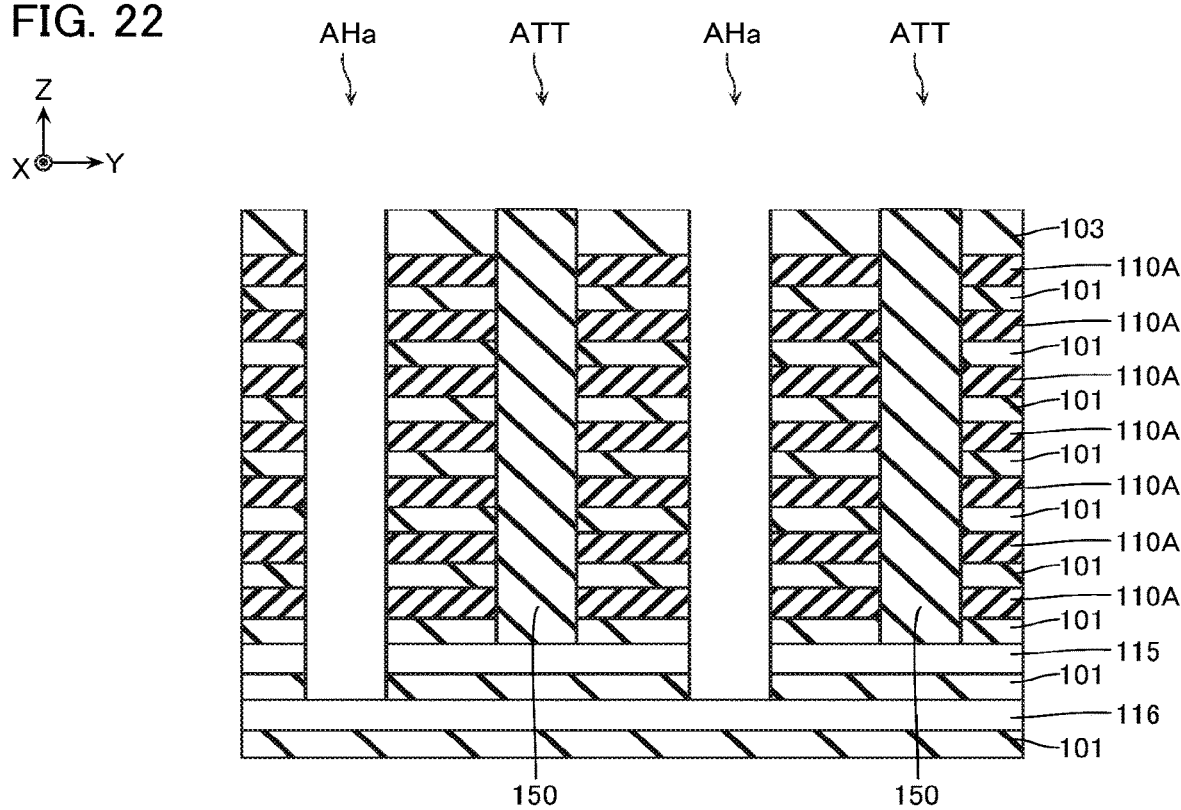
FIG. 22 is a schematic cross-sectional view illustrating the manufacturing method.

Next, as illustrated in FIG. 21 and FIG. 22, the semiconductor layers 175 are removed from insides of the openings AHa. This process is performed by wet etching or the like. The insulating layers 174 are removed from the insides of the openings AHa, and further, the bottom portions of the openings AHa are removed until the positions of the bottom surfaces of the openings AHa match the position of the upper surface of the semiconductor layer 116. This process is performed by RIE or the like.

Figure 23:
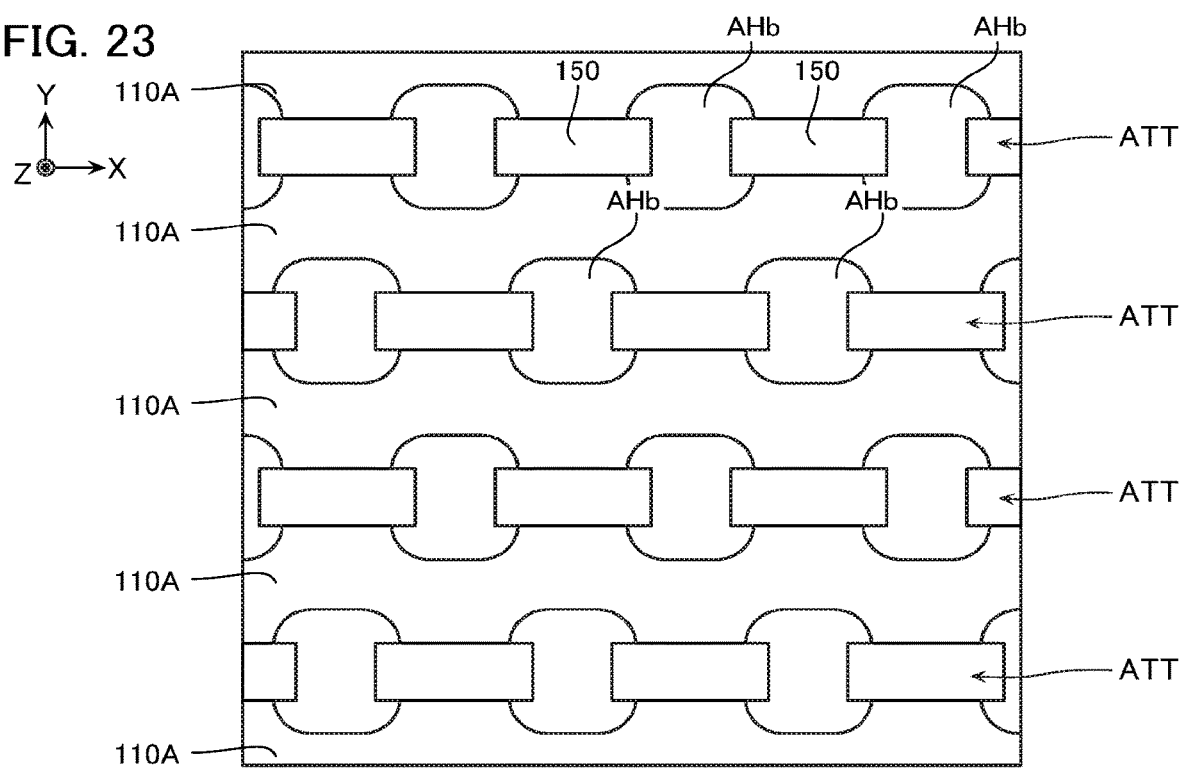
FIG. 23 is a schematic cross-sectional view illustrating the manufacturing method.
Figure 24:
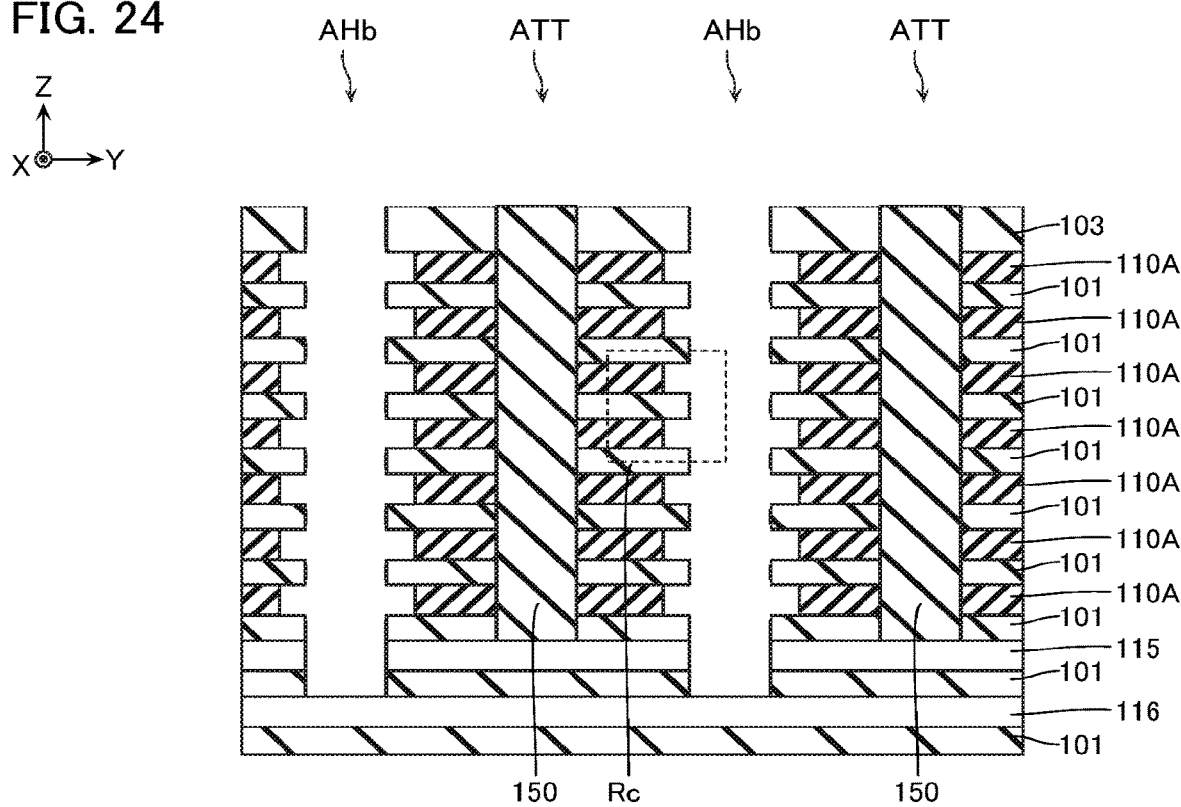
FIG. 24 is a schematic cross-sectional view illustrating the manufacturing method.

Next, as illustrated in FIG. 23 and FIG. 24, parts of the sacrifice layers 110A are removed via the openings AHa, thus forming openings AHb. By this process, parts positioned in the proximities of the openings AHa in the upper surfaces and the lower surfaces of the insulating layers 101 are exposed. This process is performed by wet etching or the like.

Figure 30:
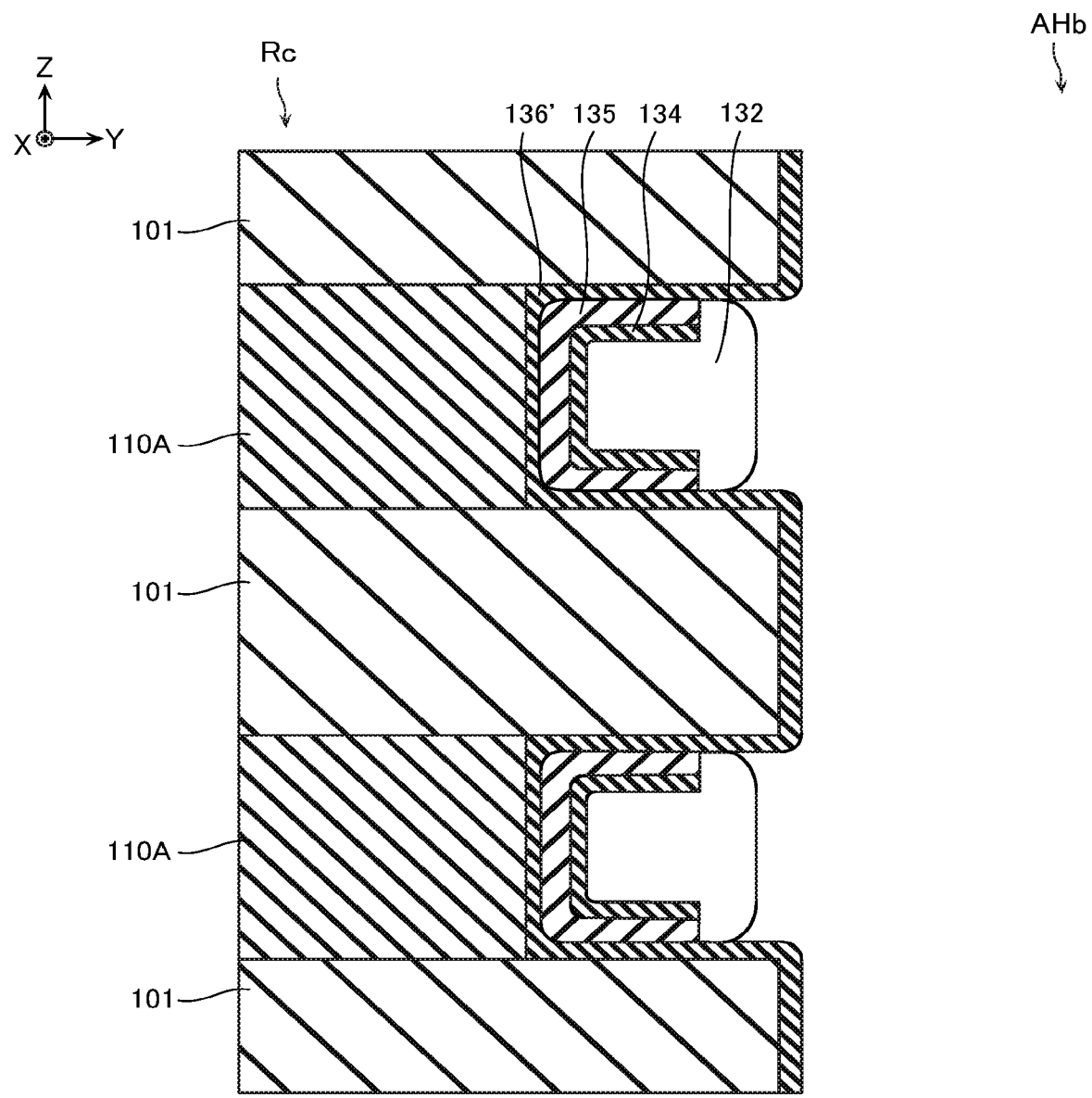
FIG. 30 is a schematic cross-sectional view illustrating the manufacturing method.
Figure 31:
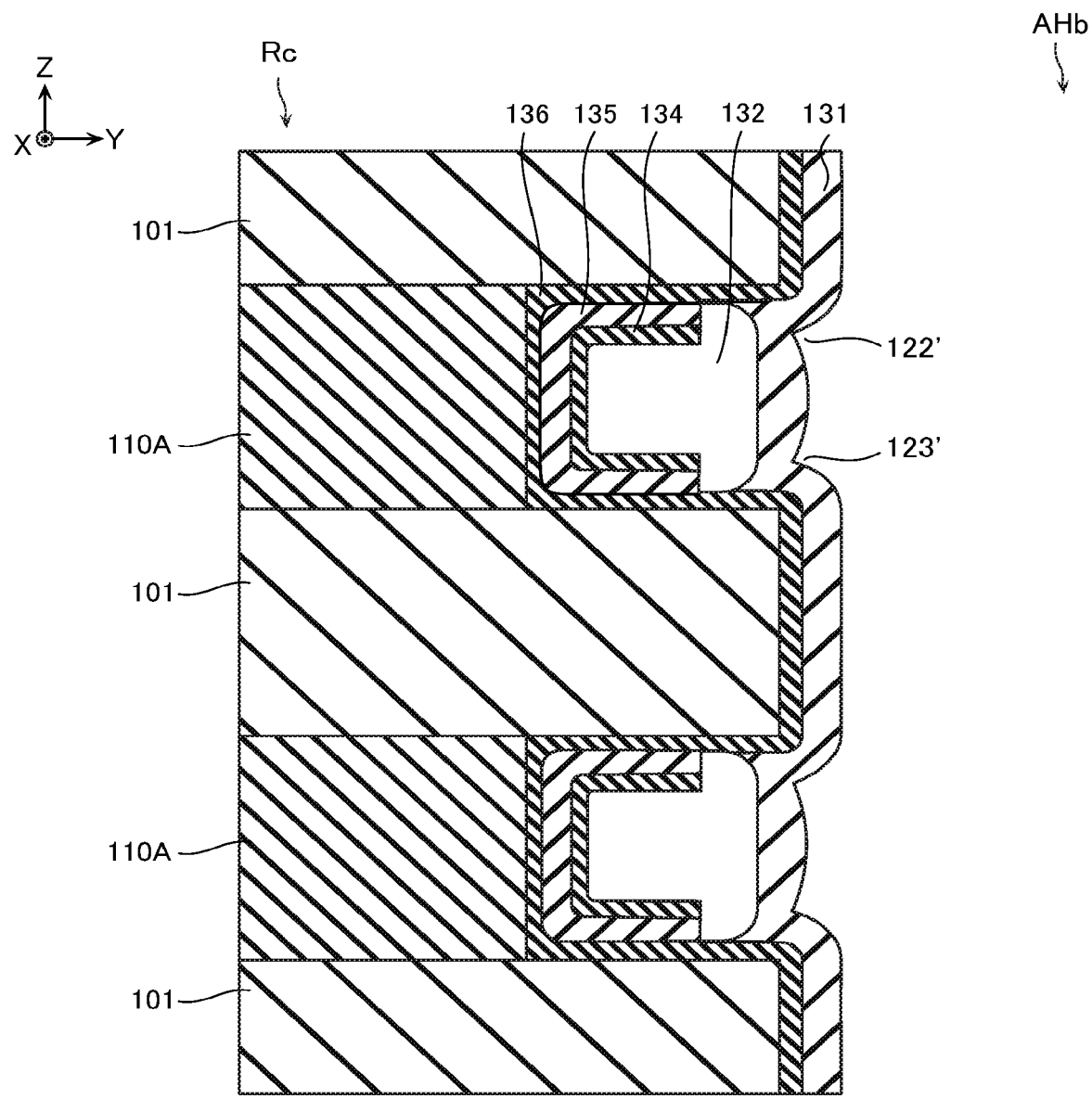
FIG. 31 is a schematic cross-sectional view illustrating the manufacturing method.
Figure 32:
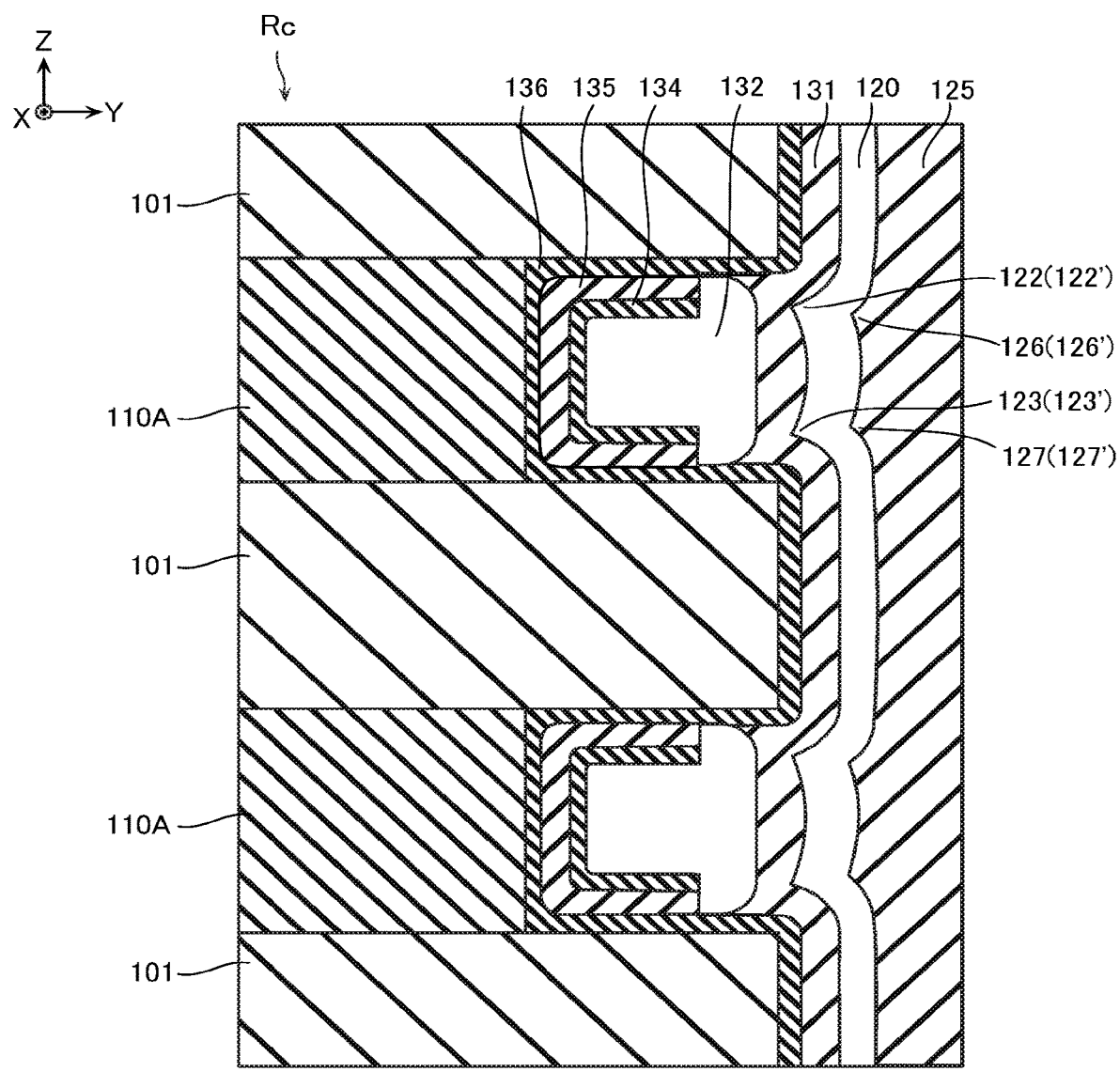
FIG. 32 is a schematic cross-sectional view illustrating the manufacturing method.

The following processes are described based on the cross-sectional views illustrated in FIG. 25 to FIG. 32. FIG. to FIG. 32 are schematic diagrams illustrating an enlarged part corresponding to a region Rc of FIG. 24.

Figure 25:
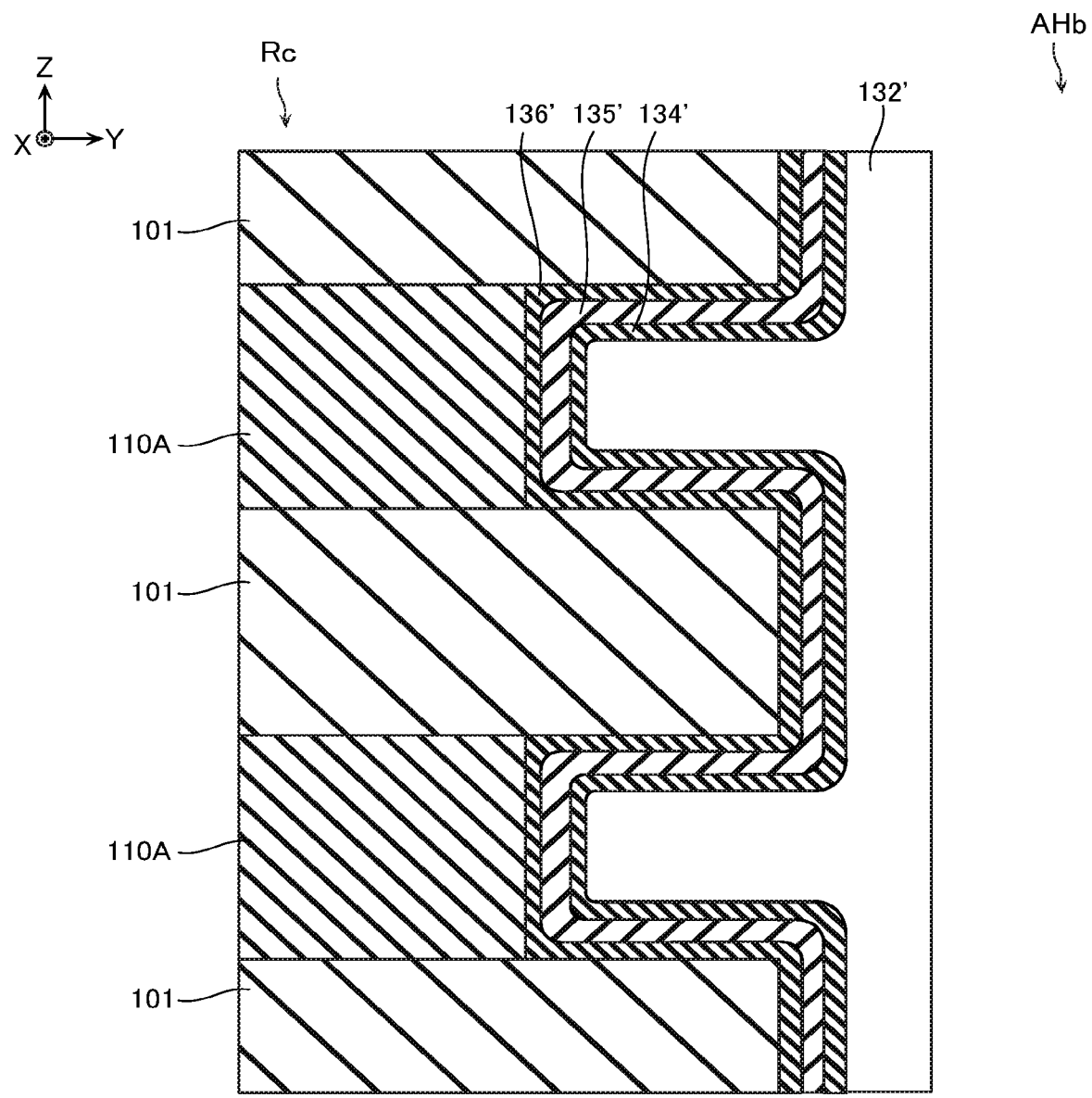
FIG. 25 is a schematic cross-sectional view illustrating the manufacturing method.

Next, as illustrated in FIG. 25, an insulating layer 136', a high dielectric constant layer 135', an insulating layer 134', and a semiconductor layer 132' are formed in this order on the side surface of the opening AHb via the opening AHb. The insulating layer 136' is silicon oxide ($SiO_2$) or the like. The high dielectric constant layer 135' is, for example, an insulating metal oxide layer of hafnium silicate (HfSiO) or the like. The insulating layer 134' is, for example, a stacked film or the like containing silicon oxide ($SiO_2$) or the like, or containing titanium nitride (TiN) and silicon oxide ($SiO_2$). The semiconductor layer 132' is, for example, polycrystalline silicon or the like containing N-type impurities, such as phosphorus (P), or P-type impurities, such as boron (B). This process is performed by CVD or the like.

Figure 26:
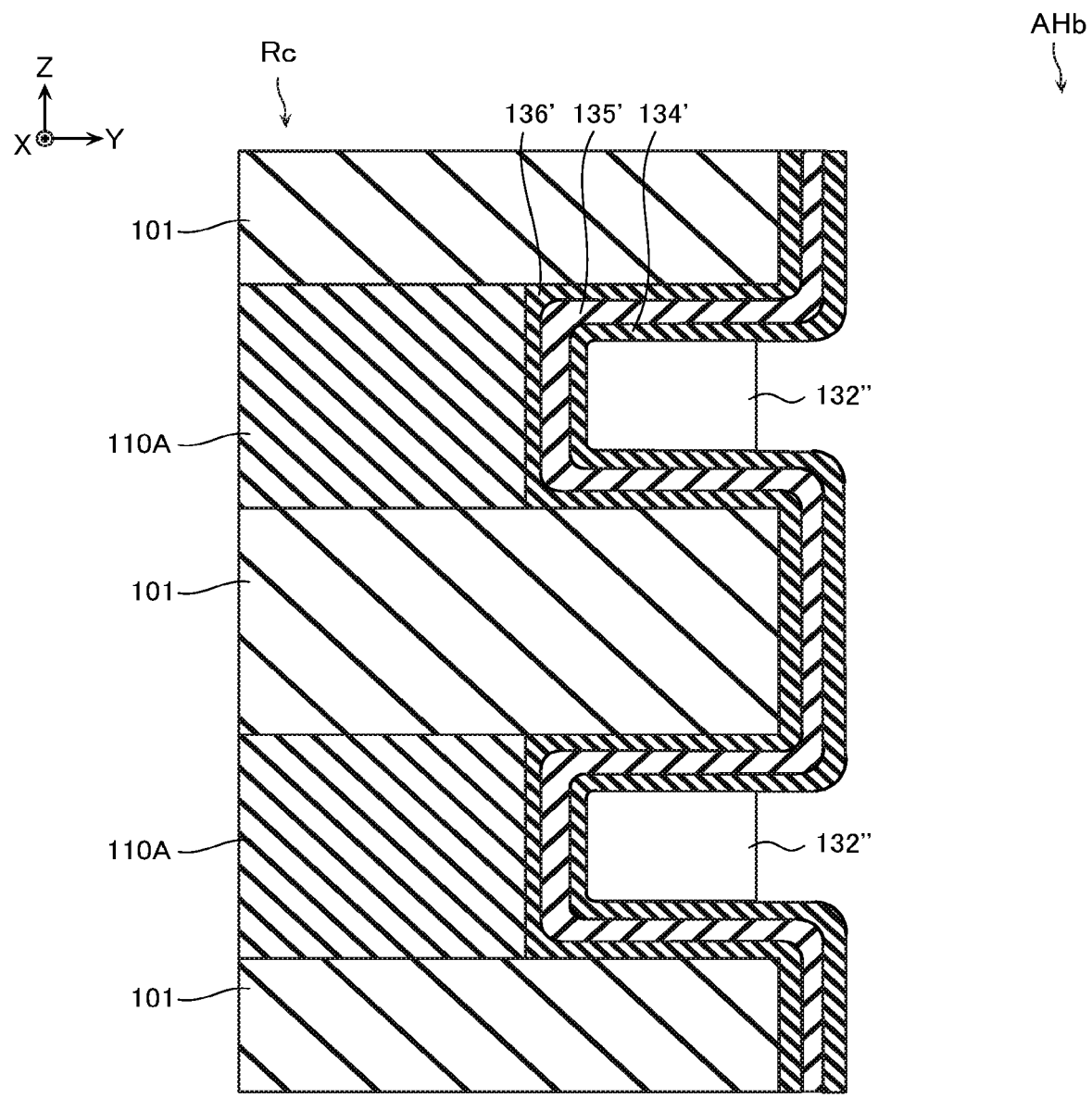
FIG. 26 is a schematic cross-sectional view illustrating the manufacturing method.

Next, as illustrated in FIG. 26, the semiconductor layer 132' is partially removed, thereby forming a plurality of semiconductor layers 132" arranged in the Z-direction corresponding to the sacrifice layers 110A. This process is performed by wet etching or the like.

Figure 27:
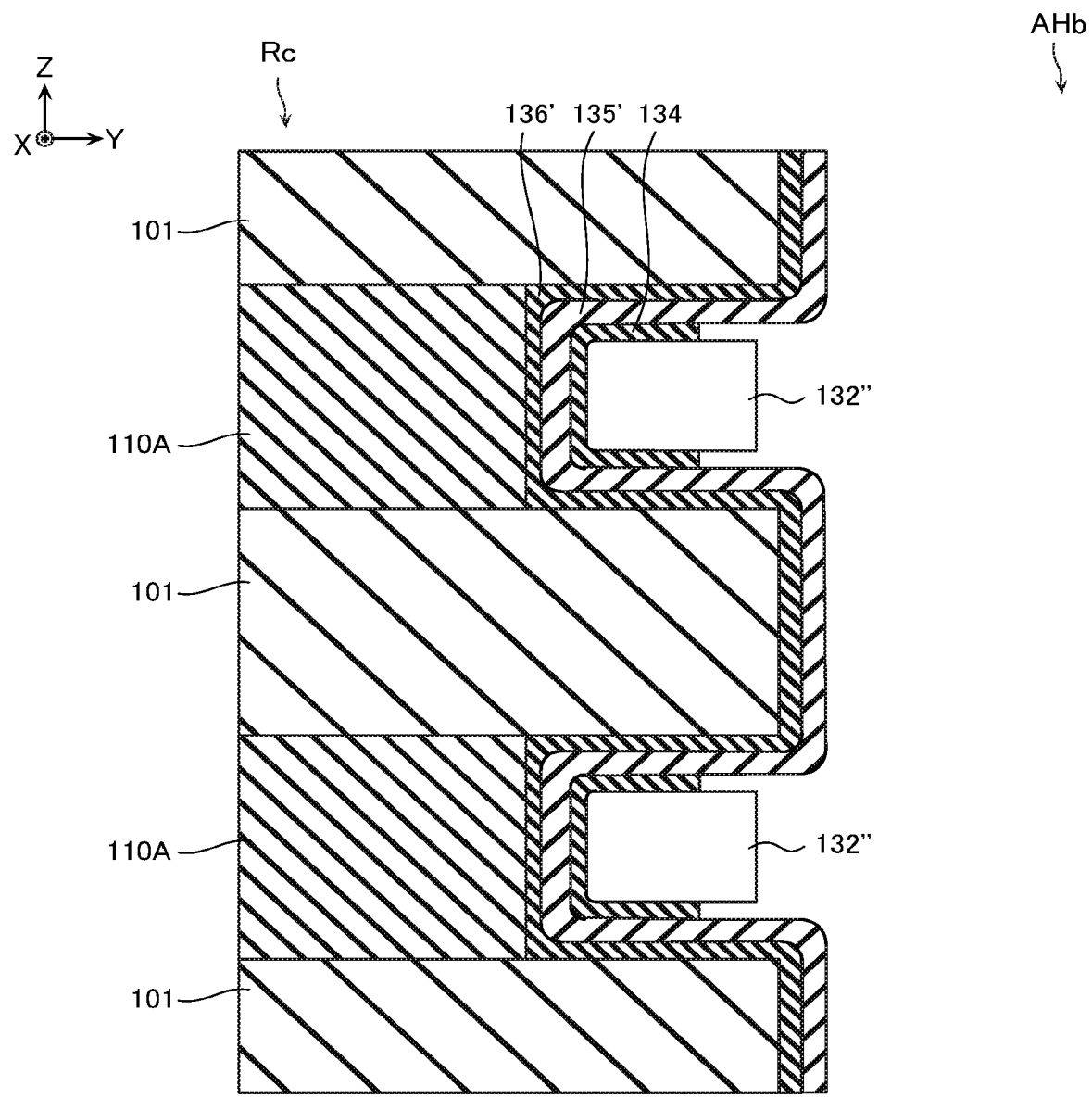
FIG. 27 is a schematic cross-sectional view illustrating the manufacturing method.

Next, as illustrated in FIG. 27, the insulating layer 134' is partially removed, thereby forming a plurality of insulating layers 134 arranged in the Z-direction corresponding to the sacrifice layers 110A. An end surface in the opening AHb side of the insulating layer 134 is closer to the sacrifice layer 110A than an end surface in the opening AHb side of the semiconductor layer 132". This process is performed by wet etching or the like.

Figure 28:
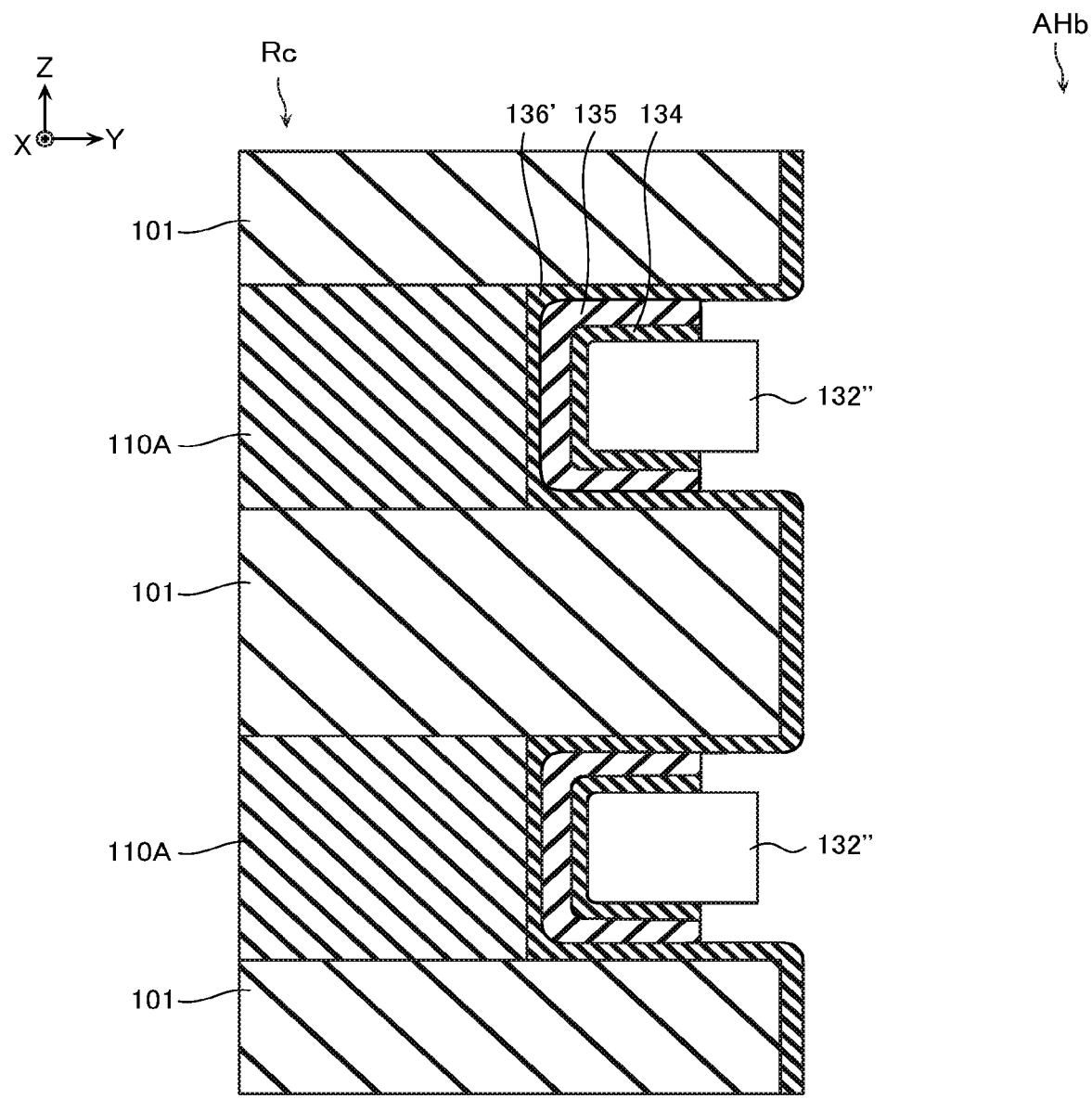
FIG. 28 is a schematic cross-sectional view illustrating the manufacturing method.

Next, as illustrated in FIG. 28, the high dielectric constant layer 135' is partially removed, thereby forming a plurality of high dielectric constant layers 135 arranged in the Z-direction corresponding to the sacrifice layers 110A. An end surface in the opening AHb side of the high dielectric constant layer 135 is disposed at a position similar to that of the end surface in the opening AHb side of the insulating layer 134, and closer to the sacrifice layer 110A than the end surface in the opening AHb side of the semiconductor layer 132'. This process is performed by wet etching or the like.

Figure 29:
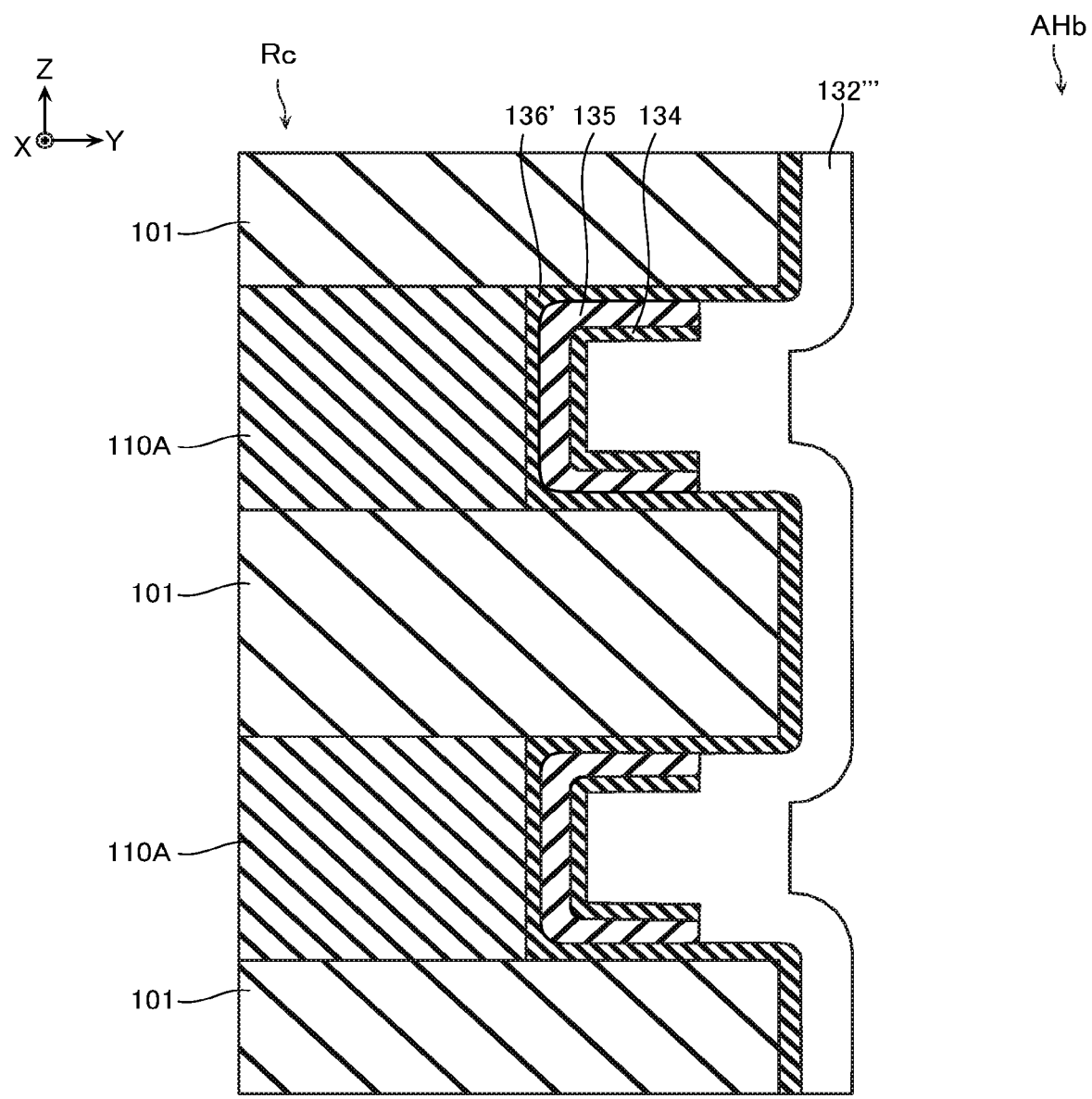
FIG. 29 is a schematic cross-sectional view illustrating the manufacturing method.

Next, as illustrated in FIG. 29, a film of a material the same as that of the semiconductor layer 132", for example, non-doped polycrystalline silicon (Si) is formed via the opening AHb, thus forming a semiconductor layer 132'''. This process is performed by CVD or the like.

Next, as illustrated in FIG. 30, the semiconductor layer 132''' is partially removed via the opening AHb, thereby forming a plurality of electric charge accumulating layers 132 arranged in the Z-direction corresponding to the sacrifice layers 110A. This process is performed by wet etching or the like. After performing the process illustrated in FIG. 26, a natural oxide film (not illustrated) is formed on an exposed surface of the semiconductor layer 132" that becomes the center portion of the electric charge accumulating layer 132. Therefore, in the semiconductor layer 132", the progress of etching delays in the part formed in the process illustrated in FIG. 26 compared with the upper and lower end portions. Consequently, the end surface in the opening AHb side of the electric charge accumulating layer 132 has a curved shape in which the center portion protrudes to the opening AHb side and the upper and lower end portions gradually retreat in a direction separating from the opening AHb side.

Next, as illustrated in FIG. 31, the tunnel insulating layer 131 is formed on an inner peripheral surface of the opening AHb. This process is performed by CVD or the like. When the tunnel insulating layer 131 is formed by the method such as CVD, the tunnel insulating layer 131 extends in the Z-direction along the inner peripheral surface of the opening AHb. The tunnel insulating layer 131 deeply enters the sacrifice layer 110A side at the upper and lower end portions retreating to the sacrifice layer 110A side of the electric charge accumulating layer 132. Accordingly, in the surface in the opening AHb side of the tunnel insulating layer 131, concave portions 122', 123' are formed at positions inside in the Z-direction with respect to the corner portions at upper and lower ends in the surface in the opening AHb side of the electric charge accumulating layer 132.

Next, a part covering the bottom surface of the opening AHb of the tunnel insulating layer 131 is removed. This process is performed by RIE or the like.

Next, as illustrated in FIG. 32, the semiconductor layer 120 and the insulating layer 125 are formed inside the opening AHb. This process is performed by CVD or the like. In an interface between the semiconductor layer 120 and the tunnel insulating layer 131, the protrusions 122, 123, which are illustrated in FIG. 6, fitting to the concave portions 122', 123' of the tunnel insulating layer 131 are formed. In the surface in the opening AHb side of the semiconductor layer 120, concave portions 126', 127' are formed at positions corresponding to the protrusions 122, 123. In an interface between the insulating layer 125 and the semiconductor layer 120, protrusions 126, 127, which are illustrated in FIG. 6, fitting to the concave portions 126', 127' of the semiconductor layer 120 are formed.

Next, the plurality of sacrifice layers 110A are removed via an opening (not illustrated). This process is performed by wet etching or the like.

Next, as illustrated in FIG. 6, the metal oxide layer 113 and the barrier conductive layer 111 are formed on the upper surface and the lower surface of the insulating layer 101 and the side surface in the Y-direction of the insulating layer 136 via an opening (not illustrated). The conductive layers 110 are formed so as to fill cavities formed by removing the plurality of sacrifice layers 110A. This process is performed by CVD or the like.

Then, the bit line contact BLC, the bit line BL, and the like are formed, thus manufacturing the semiconductor memory device according to the first embodiment.

Comparative Example

Figure 33:
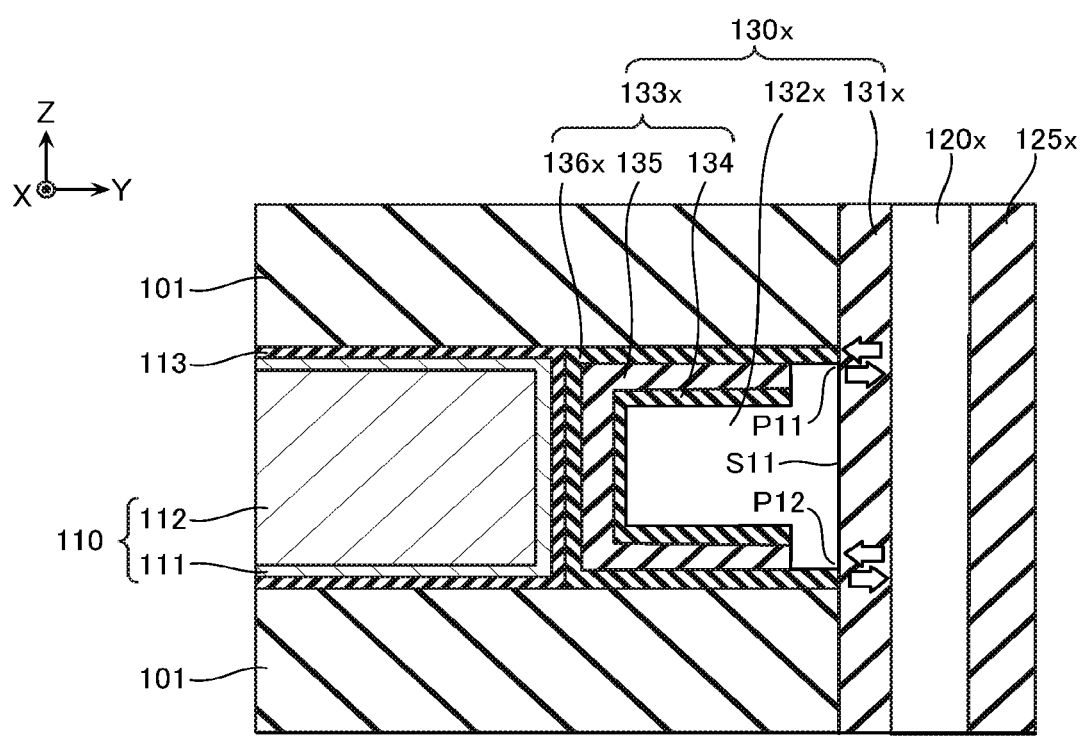
FIG. 33 is a schematic cross-sectional view of a semiconductor memory device according to a comparative example.

FIG. 33 is a schematic cross-sectional view of a semiconductor memory device according to the comparative example, and corresponds to the upper half of FIG. 6.

The semiconductor memory device according to the comparative example is different from the first embodiment, and includes a semiconductor layer 120x, an insulating layer 125x, a tunnel insulating layer 131x, an electric charge accumulating layer 132x, a block insulating layer 133x, and an insulating layer 136x instead of the semiconductor layer 120, the insulating layer 125, the gate insulating layer 130, the tunnel insulating layer 131, the electric charge accumulating layer 132, the block insulating layer 133, and the insulating layer 136.

The semiconductor layer 120x is different from the semiconductor layer 120 illustrated in FIG. 6, and not provided with the protrusions 122, 123. The electric charge accumulating layer 132x is different from the electric charge accumulating layer 132 illustrated in FIG. 6, and includes an opposed surface S11 that is opposed to the semiconductor layer 120x and linearly extends in the Z-direction. The tunnel insulating layer 131x, the semiconductor layer 120x, and the insulating layer 125x linearly extend in the Z-direction. The insulating layer 136x is not disposed between the insulating layer 101 and the tunnel insulating layer 131x, and separated in the Z-direction via the insulating layer 101.

Effects of First Embodiment

Figure 34:
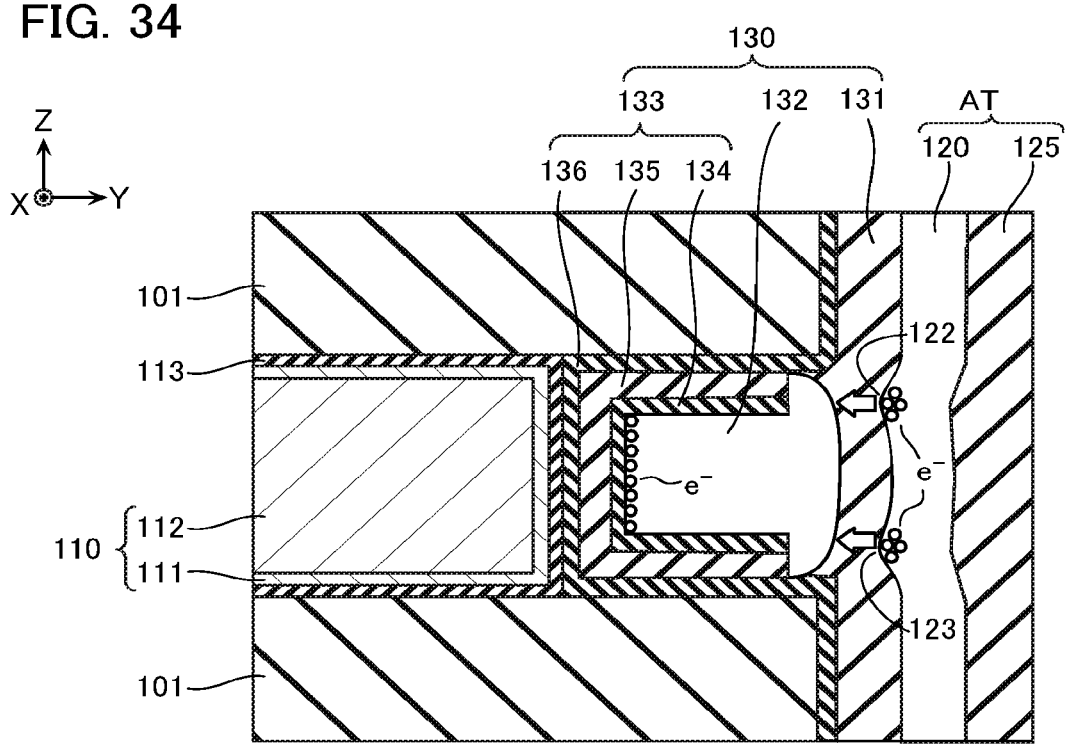
FIG. 34 is a schematic cross-sectional view of the semiconductor memory device according to the first embodiment.

FIG. 34 is a schematic cross-sectional view illustrating a writing operation of the semiconductor memory device of the first embodiment. When the writing operation to the memory cell MC is performed, negative electric charges e⁻ are accumulated in the electric charge accumulating layer 132. The negative electric charges e⁻ are accumulated by applying a high voltage to the conductive layer 110, applying a low-voltage to the semiconductor layer 120, and drawing the negative electric charges e⁻ from the semiconductor layer 120 to the electric charge accumulating layer 132 via the tunnel insulating layer 131.

In the write operation according to the first embodiment, since the protrusions 122, 123 formed at the semiconductor layer 120 are the closest to the electric charge accumulating layer 132, the negative electric charges e⁻ concentrate around the protrusions 122, 123. In the first embodiment, since electric fields in the protrusions 122, 123 become fringe electric fields, the electric fields concentrate around the protrusions 122, 123. This allows appropriately moving the negative electric charges e⁻ concentrated around the protrusions 122, 123 to the electric charge accumulating layer 132, thus providing an excellent writing characteristic.

Figure 35:
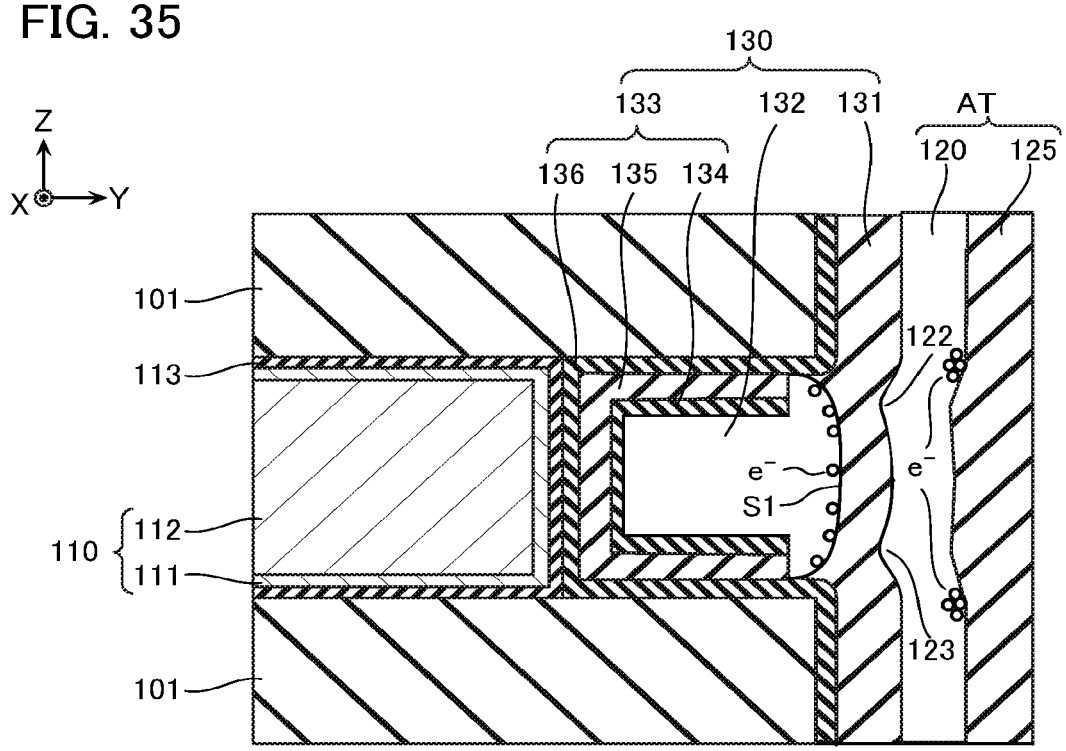
FIG. 35 is a schematic cross-sectional view of the semiconductor memory device.

FIG. 35 is a schematic cross-sectional view illustrating a data latching state of the semiconductor memory device of the first embodiment.

After the writing operation, when the voltage of the electric charge accumulating layer 132 becomes lower than that of the semiconductor layer 120, the negative electric charges e⁻ are drawn to the semiconductor layer 120 side. Here, the negative electric charges e⁻ accumulated in the electric charge accumulating layer 132 leak to the semiconductor layer 120 side via the tunnel insulating layer 131 at a high temperature in some cases, thus possibly causing a degradation of Data Retention (DR) or the like. When the negative electric charges e⁻ leak to the semiconductor layer 120 side from the electric charge accumulating layer 132, a threshold voltage of the memory cell MC decreases, thereby causing a bit error. Here, in the semiconductor memory device of the first embodiment, as illustrated in FIG. 35, since the distance between the opposed surface S1 of the electric charge accumulating layer 132 and the semiconductor layer 120 is approximately uniform or the shortest at the proximities of the protrusions 122, 123, the negative electric charges e⁻ are present in the whole opposed surface S1 of the electric charge accumulating layer 132, or concentrate around the proximities of the protrusions 122, 123. However, since the opposed surface S1 to the tunnel insulating layer 131 of the electric charge accumulating layer 132 is smoothly curved, the electric fields do not concentrate around the opposed surface S1. Distances between the corner portions having the smallest curvature radius and the protrusions 122, 123 are larger than the shortest distance between the protrusions 122, 123 of the semiconductor layer 120 and the electric charge accumulating layer 132, and for example, 4/3 or more of the shortest distance. Therefore, in the data latching state after the writing operation, the negative electric charges e⁻ latched by the electric charge accumulating layer 132 are less likely to leak to the semiconductor layer 120 side via the tunnel insulating layer 131.

Accordingly, the semiconductor memory device of the first embodiment is excellent in data writing characteristic, and excellent also in charge retention characteristic.

In contrast, according to the comparative example illustrated in FIG. 33, the negative electric charges e⁻ in the electric charge accumulating layer 132 concentrate around the whole opposed surface S11 to the semiconductor layer 120x of the electric charge accumulating layer 132x. The electric fields mostly concentrate around the corner portions P11, P12 at both ends in the Z-direction of the opposed surface S11 to the semiconductor layer 120x of the electric charge accumulating layer 132x. Therefore, during the writing operation, the negative electric charges e⁻ move from the semiconductor layer 120x to the electric charge accumulating layer 132 via the tunnel insulating layer 131x passing through the corner portions P11, P12. Meanwhile, also in the data latching state, the electric fields concentrate around the corner portions P11, P12. Therefore, the negative electric charges e⁻ easily leak to the semiconductor layer 120x via the tunnel insulating layer 131x passing through the corner portions P11, P12. Thus, in the case of the comparative example, the charge retention characteristic is poor compared with the semiconductor memory device of the first embodiment.

Second Embodiment

Figure 36:
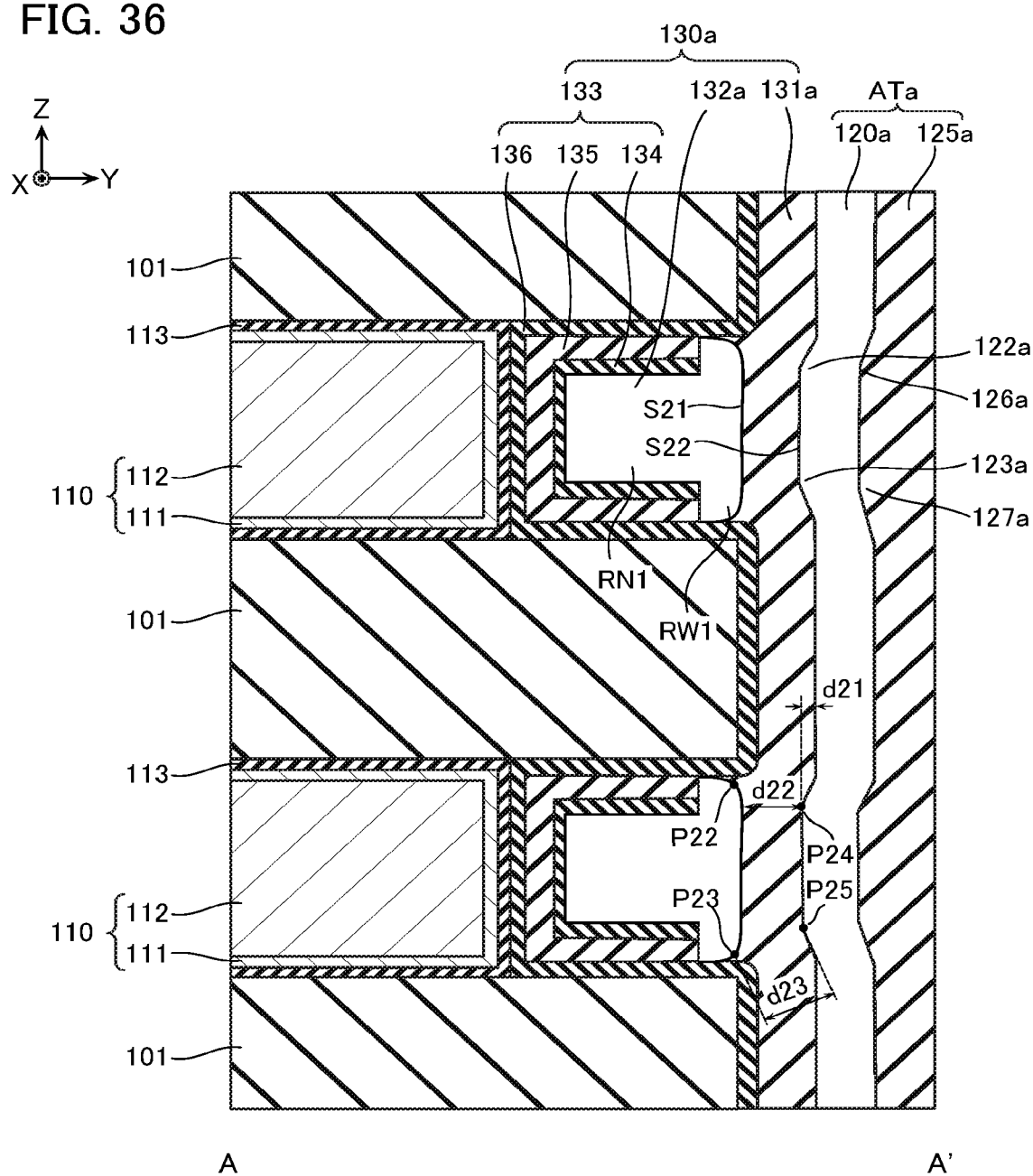
FIG. 36 is a schematic cross-sectional view of a semiconductor memory device according to a second embodiment.

Next, a semiconductor memory device according to the second embodiment will be described with reference to FIG. 36. FIG. 36 is a schematic cross-sectional view illustrating a configuration of a part corresponding to FIG. 6 in the semiconductor memory device according to the second embodiment.

The semiconductor memory device according to the second embodiment is basically configured similarly to the semiconductor memory device according to the first embodiment. However, the semiconductor memory device according to the second embodiment is different from the first embodiment, and includes a semiconductor layer 120a, an insulating layer 125a, a trench structure ATa, a gate insulating layer 130a, a tunnel insulating layer 131a, and an electric charge accumulating layer 132a instead of the semiconductor layer 120, the insulating layer 125, the trench structure AT, the gate insulating layer 130, the tunnel insulating layer 131, and the electric charge accumulating layer 132.

The electric charge accumulating layer 132a is basically configured similarly to the electric charge accumulating layer 132 according to the first embodiment. However, an opposed surface S21 to the semiconductor layer 120a of the electric charge accumulating layer 132a linearly extends in the Z-direction excluding the proximities of the corner portions P22, P23. An opposed surface S22 to the electric charge accumulating layer 132a of the semiconductor layer 120a includes two protrusions 122a, 123a protruding toward the electric charge accumulating layer 132a. The opposed surface S22 to the electric charge accumulating layer 132a between the protrusions 122a, 123a of the semiconductor layer 120a also linearly extends in the Z-direction. An opposed surface to the semiconductor layer 120a between protrusions 126a, 127a of the insulating layer 125a also linearly extends in the Z-direction.

Protrusion amounts d21 of the semiconductor layer 120a from a portion the farthest in the Y-direction from the electric charge accumulating layer 132a to distal end portions P24, P25 of the protrusions 122a, 123a may be, for example, 1 nm or more, and may be 1 nm or more and 2 nm or less. Positions in the Z-direction of the distal end portions P24, P25 of the protrusions 122a, 123a are between positions in the Z-direction of the corner portions P22, P23 of the electric charge accumulating layer 132a. Curvature radii of the distal end portions P24, P25 of the protrusions 122a, 123a are smaller than curvature radii of the corner portions P22, P23 of the electric charge accumulating layer 132a. Shortest distances d22 between the distal end portions P24, P25 of the protrusions 122a, 123a and the electric charge accumulating layer 132a are the shortest distance between the semiconductor layer 120a and the electric charge accumulating layer 132a. The shortest distances d22 between the distal end portions P24, P25 of the protrusions 122a, 123a and the electric charge accumulating layer 132a are smaller than distances d23 between the distal end portions P24, P25 of the protrusions 122a, 123a and the corner portions P22, P23 of the electric charge accumulating layer 132a. The distance d23 may be 4/3 times or more of the shortest distance d22.

Third Embodiment

Figure 37:
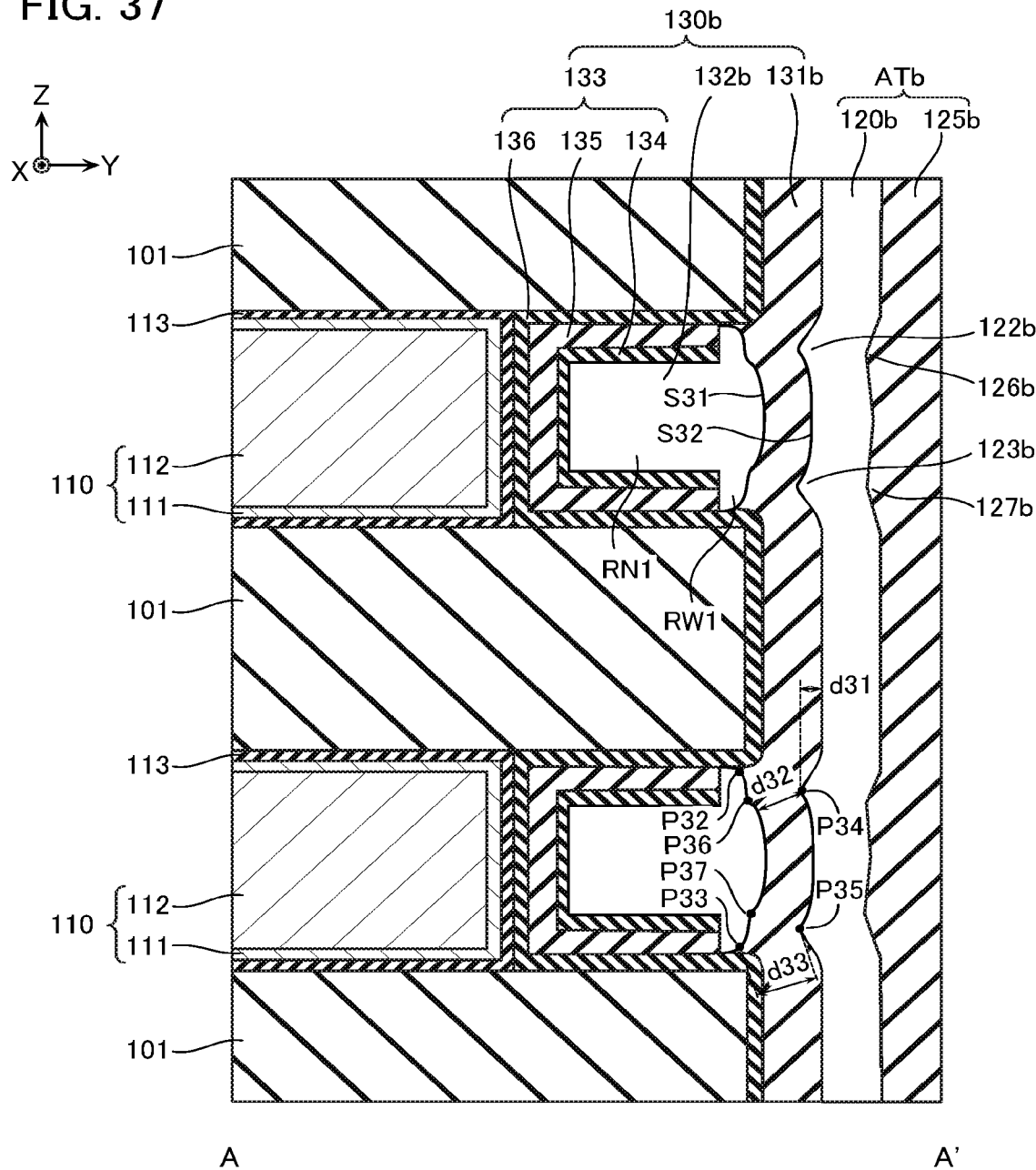
FIG. 37 is a schematic cross-sectional view of a semiconductor memory device according to a third embodiment.

Next, a semiconductor memory device according to the third embodiment will be described with reference to FIG. 37. FIG. 37 is a schematic cross-sectional view illustrating a configuration of a part corresponding to FIG. 6 in the semiconductor memory device according to the third embodiment.

The semiconductor memory device according to the third embodiment is basically configured similarly to the semiconductor memory device according to the first embodiment. However, the semiconductor memory device according to the third embodiment is different from the first embodiment, and includes a semiconductor layer 120b, an insulating layer 125b, a trench structure ATb, a gate insulating layer 130b, a tunnel insulating layer 131b, and an electric charge accumulating layer 132b instead of the semiconductor layer 120, the insulating layer 125, the trench structure AT, the gate insulating layer 130, the tunnel insulating layer 131, and the electric charge accumulating layer 132.

The electric charge accumulating layer 132b is basically configured similarly to the electric charge accumulating layer 132 according to the first embodiment. However, an opposed surface S31 to the semiconductor layer 120b of the electric charge accumulating layer 132b forms a stepped curved surface provided with concave portions P36, P37 on the way from the center to corner portions P32, P33 at both ends in the Z-direction instead of the monotonous change of the inclination from the Z-direction to the Y-direction. An opposed surface S32 to the electric charge accumulating layer 132b of the semiconductor layer 120b is curved so as to have an approximately constant film thickness of the tunnel insulating layer 131b between the opposed surface S32 and the opposed surface S31 of the electric charge accumulating layer 132b. An opposed surface to the semiconductor layer 120b of the insulating layer 125b between protrusions 126b, 127b follows the opposed surface S32.

Protrusion amounts d31 of the semiconductor layer 120b from a portion the farthest in the Y-direction from the electric charge accumulating layer 132b to distal end portions P34, P35 of protrusions 122b, 123b may be, for example, 1 nm or more, and may be 1 nm or more and 2 nm or less. Positions in the Z-direction of the distal end portions P34, P35 of the protrusions 122b, 123b are between positions in the Z-direction of the corner portions P32, P33 of the electric charge accumulating layer 132b. Curvature radii of the distal end portions P34, P35 of the protrusions 122b, 123b are smaller than curvature radii of the corner portions P32, P33 of the electric charge accumulating layer 132b. Shortest distances d32 between the distal end portions P34, P35 of the protrusions 122b, 123b and the electric charge accumulating layer 132b are the shortest distance between the semiconductor layer 120b and the electric charge accumulating layer 132b. The shortest distances d32 between the distal end portions P34, P35 of the protrusions 122b, 123b and the electric charge accumulating layer 132b are smaller than distances d33 between the distal end portions P34, P35 of the protrusions 122b, 123b and the corner portions P32, P33 of the electric charge accumulating layer 132b. The distance d33 may be 4/3 times or more of the shortest distance d32.

Fourth Embodiment

Figure 38:
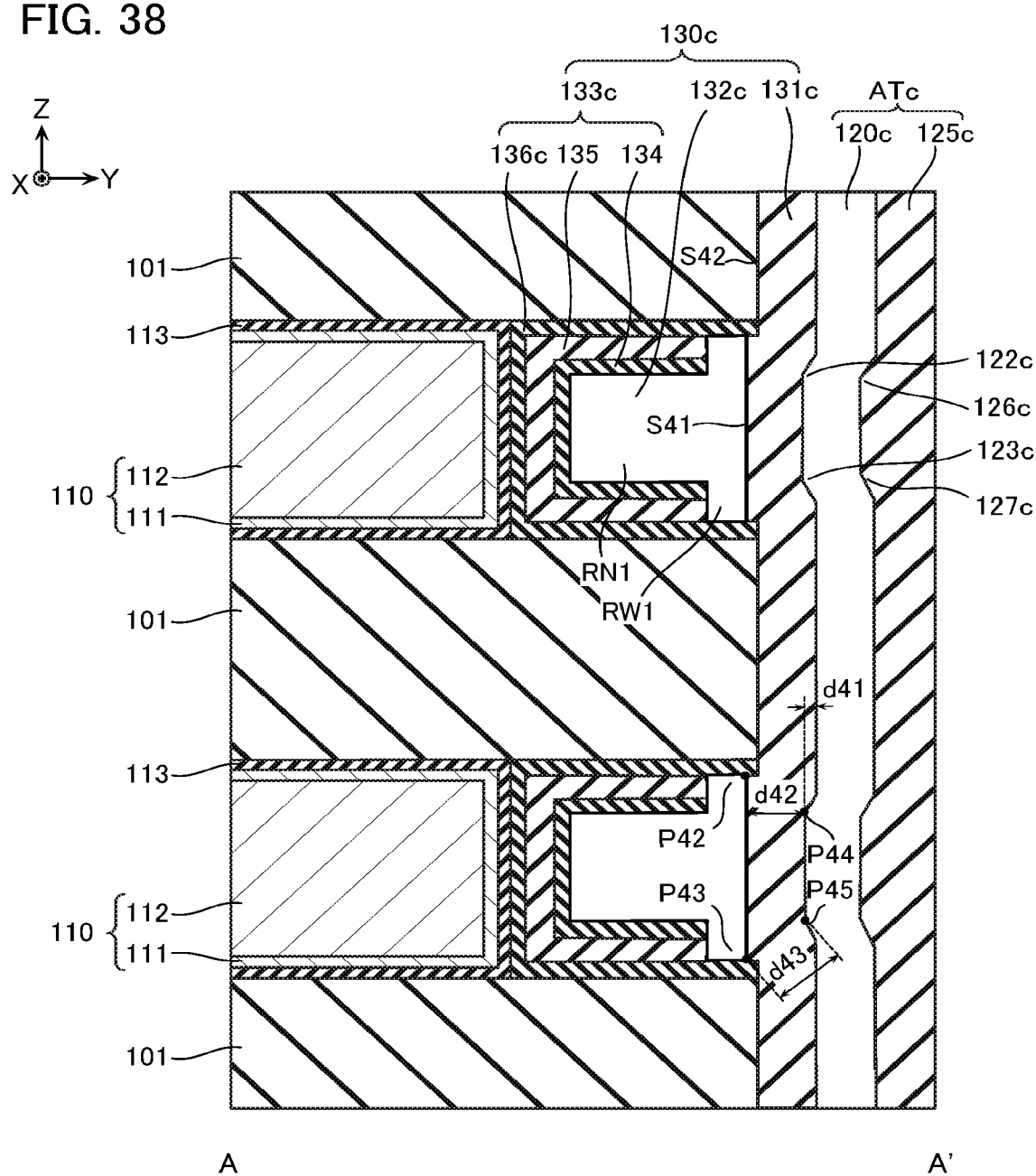
FIG. 38 is a schematic cross-sectional view of a semiconductor memory device according to a fourth embodiment.

Next, a semiconductor memory device according to the fourth embodiment will be described with reference to FIG. 38. FIG. 38 is a schematic cross-sectional view illustrating a configuration of a part corresponding to FIG. 6 in the semiconductor memory device according to the fourth embodiment.

The semiconductor memory device according to the fourth embodiment is basically configured similarly to the semiconductor memory device according to the first embodiment. However, the semiconductor memory device according to the fourth embodiment is different from the first embodiment, and includes a semiconductor layer 120c, an insulating layer 125c, a trench structure ATc, a gate insulating layer 130c, a tunnel insulating layer 131c, an electric charge accumulating layer 132c, a block insulating layer 133c, and an insulating layer 136c instead of the semiconductor layer 120, the insulating layer 125, the trench structure AT, the gate insulating layer 130, the tunnel insulating layer 131, the electric charge accumulating layer 132, the block insulating layer 133, and the insulating layer 136.

The electric charge accumulating layer 132c is basically configured similarly to the electric charge accumulating layer 132 according to the first embodiment. However, an opposed surface S41 to the semiconductor layer 120c of the electric charge accumulating layer 132c linearly extends in the Z-direction. The opposed surface S41 in the semiconductor layer 120c side of the electric charge accumulating layer 132c retreats in a direction separating from the semiconductor layer 120c in the Y-direction with respect to an opposed surface S42 to the semiconductor layer 120c of the insulating layer 101. The insulating layer 136c extends to a Y-directional position approximately the same as that of the insulating layer 101, and is separated to upper and lower sides at a Z-directional position at which the insulating layer 101 exists. Since the tunnel insulating layer 131c has an interface with the opposed surface S41 of the electric charge accumulating layer 132c protruding to the electric charge accumulating layer 132c side, the semiconductor layer 120c is provided with protrusions 122c, 123c in an interface between the tunnel insulating layer 131c and the semiconductor layer 120c in its opposite side. The insulating layer 125c is also provided with protrusions 126c, 127c corresponding to the protrusions 122c, 123c.

Protrusion amounts d41 of the semiconductor layer 120c from a portion the farthest in the Y-direction from the electric charge accumulating layer 132c to distal end portions P44, P45 of the protrusions 122c, 123c may be, for example, 1 nm or more, and may be 1 nm or more and 2 nm or less. Positions in the Z-direction of the distal end portions P44, P45 of the protrusions 122c, 123c are between positions in the Z-direction of the corner portions P42, P43 of the electric charge accumulating layer 132c. In the fourth embodiment, curvature radii of the distal end portions P44, P45 of the protrusions 122c, 123c may be smaller than or larger than curvature radii of the corner portions P42, P43 of the electric charge accumulating layer 132c. Shortest distances d42 between the distal end portions P44, P45 of the protrusions 122c, 123c and the electric charge accumulating layer 132c are the shortest distance between the semiconductor layer 120c and the electric charge accumulating layer 132c. The shortest distances d42 between the distal end portions P44, P45 of the protrusions 122c, 123c and the electric charge accumulating layer 132c are smaller than distances d43 between the distal end portions P44, P45 of the protrusions 122c, 123c and the corner portions P42, P43 of the electric charge accumulating layer 132c. The distance d43 may be 4/3 times or more of the shortest distance d42.

Also in the fourth embodiment, by disposing the protrusions 122c, 123c to the semiconductor layer 120c, the distance between the semiconductor layer 120c and the electric charge accumulating layer 132c can be reduced to the shortest at the positions of the protrusions 122c, 123c. Accordingly, similarly to the first embodiment to the third embodiment, an excellent data writing characteristic and an excellent data latching characteristic are provided.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a semiconductor layer extending in a first direction;
   a conductive layer opposed to the semiconductor layer in a second direction intersecting with the first direction;
   an electric charge accumulating layer disposed between the semiconductor layer and the conductive layer;
   a first insulating layer disposed between the semiconductor layer and the electric charge accumulating layer; and a second insulating layer disposed between the conductive layer and the electric charge accumulating layer, wherein the semiconductor layer includes at least one protrusion protruding in the second direction toward the electric charge accumulating layer, a position in the first direction of the protrusion is inside with respect to corner portions at both ends in the first direction of a surface opposed to the semiconductor layer in the electric charge accumulating layer, and a distance between a corner portion of the electric charge accumulating layer and the protrusion of the semiconductor layer is 4/3 or more of a shortest distance between the protrusion of the semiconductor layer and the electric charge accumulating layer.

2. The semiconductor memory device according to claim 1, wherein the shortest distance between the protrusion of the semiconductor layer and the electric charge accumulating layer is equal to a shortest distance between the semiconductor layer and the electric charge accumulating layer.

3. The semiconductor memory device according to claim 1, wherein each of the corner portions of the electric charge accumulating layer is a portion having a smallest curvature radius protruding to the semiconductor layer side between each end and a center in the first direction of the surface opposed to the semiconductor layer in the electric charge accumulating layer.

4. A semiconductor memory device comprising:

a semiconductor layer extending in a first direction;

a first conductive layer opposed to the semiconductor layer in a second direction intersecting with the first direction;

a second conductive layer disposed spaced in the first direction from the first conductive layer, and opposed to the semiconductor layer in the second direction;

a first electric charge accumulating layer disposed between the semiconductor layer and the first conductive layer;

a second electric charge accumulating layer disposed between the semiconductor layer and the second conductive layer;

a first insulating layer disposed between the semiconductor layer and the first electric charge accumulating layer and between the semiconductor layer and the second electric charge accumulating layer; and a second insulating layer disposed between the first conductive layer and the first electric charge accumulating layer and between the second conductive layer and the second electric charge accumulating layer, wherein the semiconductor layer includes at least one protrusion protruding in the second direction toward the first electric charge accumulating layer on a surface opposed to the first electric charge accumulating layer, a position in the first direction of the protrusion is inside with respect to corner portions at both ends in the first direction of a surface opposed to the semiconductor layer in the first electric charge accumulating layer, and in a region of the semiconductor layer between a portion opposed to the first electric charge accumulating layer in the second direction and a portion opposed to the second electric charge accumulating layer in the second direction, a distance in the second direction between a portion that is farthest in the second direction from the first electric charge accumulating layer and a distal end of the protrusion of the semiconductor layer is 1 nm or more.

5. The semiconductor memory device according to claim 4, wherein each of the corner portions of the first electric charge accumulating layer is a portion having a smallest curvature radius protruding to the semiconductor layer side between each end and a center in the first direction of the surface opposed to the semiconductor layer in the first electric charge accumulating layer.

6. A semiconductor memory device comprising:

a semiconductor layer extending in a first direction;

a first conductive layer disposed in one side in a second direction intersecting with the first direction of the semiconductor layer, and opposed to the semiconductor layer in the second direction;

a second conductive layer disposed in another side in the second direction of the semiconductor layer, and opposed to the semiconductor layer in the second direction;

a first electric charge accumulating layer disposed between the semiconductor layer and the first conductive layer;

a second electric charge accumulating layer disposed between the semiconductor layer and the second conductive layer;

a first insulating layer disposed between the semiconductor layer and the first electric charge accumulating layer and between the semiconductor layer and the second electric charge accumulating layer; and a second insulating layer disposed between the first conductive layer and the first electric charge accumulating layer and between the second conductive layer and the second electric charge accumulating layer, wherein the semiconductor layer includes at least one protrusion protruding in the second direction toward the first electric charge accumulating layer on a surface opposed to the first electric charge accumulating layer, a position in the first direction of the protrusion is inside with respect to corner portions at both ends in the first direction of a surface opposed to the semiconductor layer in the first electric charge accumulating layer, and a distance between a corner portion of the electric charge accumulating layer and the protrusion of the semiconductor layer is 4/3 or more of a shortest distance between the protrusion of the semiconductor layer and the electric charge accumulating layer.

7. The semiconductor memory device according to claim 6, wherein each of the corner portions of the first electric charge accumulating layer is a portion having a smallest curvature radius protruding to the semiconductor layer side between each end and a center in the first direction of the surface opposed to the semiconductor layer in the first electric charge accumulating layer.

* * * * *